(12) United States Patent
Chuang

(10) Patent No.: US 10,838,265 B2
(45) Date of Patent: Nov. 17, 2020

(54) DISPLAY APPARATUS

(71) Applicant: Au Optronics Corporation, Hsinchu (TW)

(72) Inventor: Hao-An Chuang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 80 days.

(21) Appl. No.: 16/194,392

(22) Filed: Nov. 19, 2018

(65) Prior Publication Data

US 2019/0369447 A1  Dec. 5, 2019

(30) Foreign Application Priority Data

May 31, 2018 (TW) .............................. 107118751 A

(51) Int. Cl.
| G02F 1/1343 | (2006.01) |
|---|---|
| G02F 1/1333 | (2006.01) |
| G02F 1/1345 | (2006.01) |
| G02F 1/1362 | (2006.01) |
| H01S 5/028 | (2006.01) |
| H01S 5/042 | (2006.01) |

(52) U.S. Cl.
CPC .... G02F 1/134309 (2013.01); G02F 1/13452 (2013.01); G02F 1/13458 (2013.01); G02F 1/133345 (2013.01); G02F 1/136286 (2013.01); H01S 5/028 (2013.01); H01S 5/0425 (2013.01)

(58) Field of Classification Search
CPC ................................................ G02F 1/134309
See application file for complete search history.

(56) References Cited

U.S. PATENT DOCUMENTS

| 6,793,779 B2 | 9/2004 | Ding et al. |
|---|---|---|
| 7,970,034 B2 | 6/2011 | Obata |
| 2008/0062364 A1* | 3/2008 | Lee ................... G02F 1/133553 349/113 |
| 2010/0226403 A1 | 9/2010 | Obata |
| 2012/0154732 A1* | 6/2012 | Morita ................. G02F 1/1339 349/143 |
| 2014/0145171 A1* | 5/2014 | Park .................... H01L 27/3276 257/40 |
| 2014/0186978 A1* | 7/2014 | Kang ................. H01L 51/5088 438/23 |
| 2017/0082888 A1* | 3/2017 | Park .................... G02F 1/13458 |
| 2017/0082900 A1* | 3/2017 | Kong ................. G02F 1/13452 |
| 2017/0125451 A1* | 5/2017 | Kang ................. H01L 27/1244 |

FOREIGN PATENT DOCUMENTS

| CN | 101826698 | 6/2012 |
|---|---|---|
| CN | 106547152 | 3/2017 |

* cited by examiner

*Primary Examiner* — Sang V Nguyen
(74) *Attorney, Agent, or Firm* — JCIPRNET

(57) ABSTRACT

A display apparatus including a first substrate, a plurality of signal lines disposed on the first substrate, a plurality of pixels disposed on the first substrate, a second substrate disposed opposite to the first substrate, and a display medium disposed between the first substrate and the second substrate is provided. At least one of the pixels includes a thin-film transistor, a pixel electrode, a pad, and a plurality of protrusions. The thin-film transistor is electrically connected to a corresponding signal line. The pixel electrode is electrically connected to the thin-film transistor. The pad is electrically connected to the signal line. The pad covers the plurality of protrusions.

13 Claims, 20 Drawing Sheets

DISPLAY APPARATUS

CROSS-REFERENCE TO RELATED APPLICATION

This application claims the priority benefit of Taiwan application serial no. 107118751, filed on May 31, 2018. The entirety of the above-mentioned patent application is hereby incorporated by reference herein and made a part of this specification.

BACKGROUND OF THE INVENTION

Field of the Invention

The invention relates to an optoelectronic apparatus, and more particularly, to a display apparatus.

Description of Related Art

Common flat panel displays include, for instance, liquid crystal displays, organic or non-organic light-emitting diode displays, and plasma displays. Flat panel displays can be applied in various electronic products (such as televisions, desktop monitors, notebook computers, and mobile phones). The sizes of the flat panel displays of various electronic products are different, and the individual manufacture of flat panel displays with different sizes based on various electronic product requirements has a long development time and is not economical. Therefore, large-size flat panel displays can be resized to form a variety of flat panel displays of the required size. During the process of forming a flat panel display with the required size, the flat panel display first exposes the pad after being cut, and then the pad is electrically connected to a flexible printed circuit board via a conductive element. However, the contact area between the conductive element and the side wall of the pad is small, such that the contact resistance between the two is too high, thus adversely affecting the production yield of the flat panel display and the performance thereof.

SUMMARY OF THE INVENTION

The invention provides a display apparatus having good performance.

A display apparatus of an embodiment of the invention includes a first substrate, a plurality of signal lines disposed on the first substrate, a plurality of pixels disposed on the first substrate, a second substrate disposed opposite to the first substrate, and a display medium disposed between the first substrate and the second substrate. At least one pixel includes a thin-film transistor electrically connected to a corresponding signal line, a pixel electrode electrically connected to the thin-film transistor, a first pad electrically connected to the corresponding signal line, and a plurality of first protrusions covered by the first pad.

A display apparatus of an embodiment of the invention includes a first substrate, a plurality of signal lines disposed on the first substrate, a plurality of common lines disposed on the first substrate, a plurality of pixels disposed on the first substrate, a second substrate disposed opposite to the first substrate, and a display medium disposed between the first substrate and the second substrate. At least one pixel includes a thin-film transistor electrically connected to a corresponding signal line, a pixel electrode electrically connected to the thin-film transistor and disposed with a corresponding common line in an overlapping manner, a pad electrically connected to the corresponding common line, and a plurality of protrusions, wherein the pad covers the plurality of protrusions and a gap between a plurality of adjacent protrusions.

Based on the above, when a display apparatus of an embodiment of the invention is cut and polished in a resizing process, since the pad covers a plurality of protrusions, an area of a side wall of the pad formed by polishing the pad is large. Accordingly, when the conductive pattern is formed on a side wall of the first substrate, a contact area between the conductive pattern and the side wall of the pad is large and the contact resistance is small, and therefore the reliability of the resized display apparatus can be increased.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
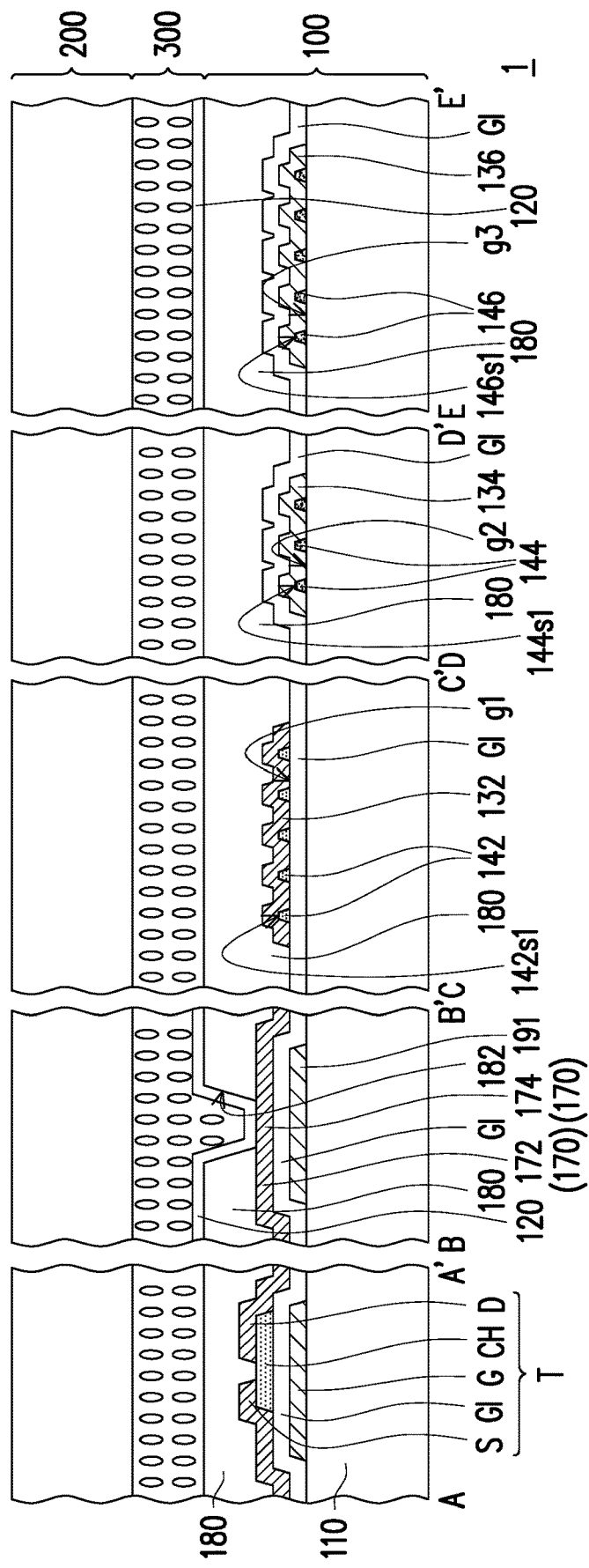
FIG. 1 is a cross section of an unresized display apparatus 1 of an embodiment of the invention.

Hereinafter, exemplary embodiments of the invention are described in detail, and examples of the exemplary embodiments are conveyed via the figures. Wherever possible, the same reference numerals are used in the figures and the descriptions to refer to the same or similar portions.

For clarity, some figures schematically show an xyz coordinate system, wherein the directions x, y, and z are perpendicular to one another. It should be mentioned that, in the present specification, the directions x, y, and z shown in each figure are only exemplary to the invention and are not intended to limit the invention, and the directions x, y, and z do not have to be perpendicular to one another in the invention.

Figure 2:
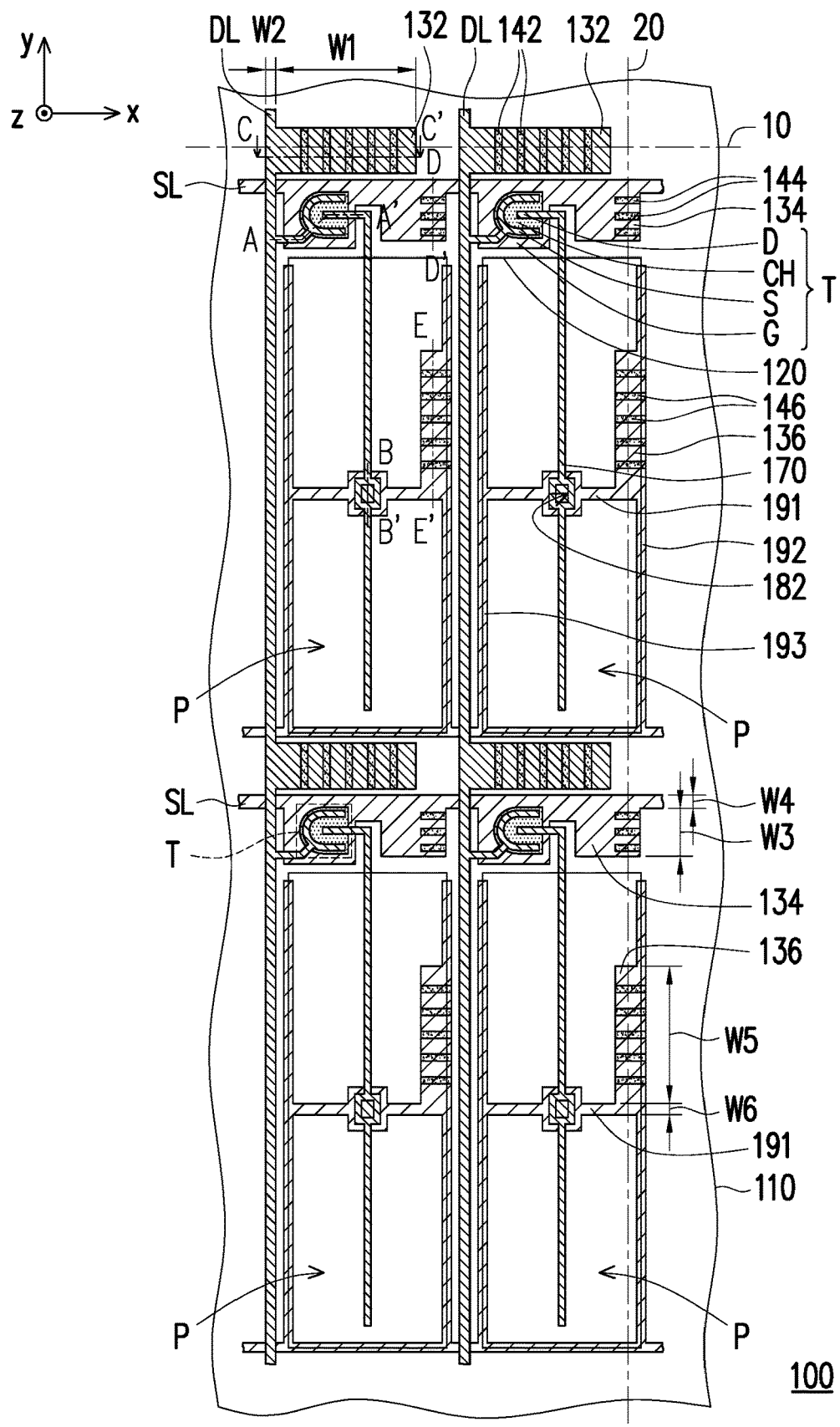
FIG. 2 is a top view of a pixel array substrate 100 of the unresized display apparatus 1 of an embodiment of the invention.

FIG. 1 is a cross section of an unresized display apparatus 1 of an embodiment of the invention. FIG. 2 is a top view of a pixel array substrate 100 of the unresized display apparatus 1 of an embodiment of the invention. The cross section of the pixel array substrate 100 of FIG. 1 corresponds to section lines A-A', B-B', C-C', D-D', and E-E' of FIG. 2.

Referring to FIG. 1 and FIG. 2, the display apparatus 1 includes a pixel array substrate 100, a second substrate 200, and a display medium 300. The pixel array substrate 100 includes a first substrate 110. The second substrate 200 is disposed opposite to the first substrate 110. The display medium 300 is disposed between the first substrate 110 and the second substrate 200. For instance, in the present embodiment, the material of the first substrate 110 and/or the second substrate 200 can be glass, quartz, organic polymer, or other suitable materials. In the present embodiment, the display medium 300 is, for instance, liquid crystal. However, the invention is not limited thereto, and in other embodiments, the display medium 300 can also be an organic electroluminescent layer or other suitable materials. The pixel array substrate 100 includes a plurality of signal lines SL and DL disposed on the first substrate 110 and a plurality of pixels P disposed on the first substrate 110. The extending direction x of the signal lines SL is intersected with the extending direction y of the signal lines DL. For instance, in the present embodiment, the extending direction x of the signal lines SL can be perpendicular to the extending direction y of the signal lines DL. However, the invention is not limited thereto, and in other embodiments, the extending direction x of the signal lines SL can also not be perpendicular to the extending direction y of the signal lines DL.

The pixels P at least include a thin-film transistor T and a pixel electrode 120 electrically connected to the thin-film transistor T. The thin-film transistor T is electrically connected to the signal lines SL and DL. Specifically, the thin-film transistor T includes a gate G, a semiconductor pattern CH, a gate-insulating layer GI disposed between the gate G and the semiconductor pattern CH, and a source S and a drain D respectively electrically connected to two different regions of the semiconductor pattern CH. The signal lines DL are electrically connected to the source S of the thin-film transistor T, and the signal lines SL are electrically connected to the gate G of the thin-film transistor T. In other words, in the present embodiment, the signal lines SL are data lines and the signal lines SL are scan lines.

The pixel electrode 120 is electrically connected to the drain D of the thin-film transistor T. For instance, in the present embodiment, the pixel array substrate 100 further includes an extended pattern 170 and an insulating layer 180, the extended pattern 170 is electrically connected to the drain D and extended outward via the drain D, the insulating layer 180 at least covers the thin-film transistor T and a portion 172 of the extended pattern 170, and the insulating layer 180 has an opening 182 overlapped with another portion 174 of the extended pattern 170. The pixel electrode 120 can be electrically connected to the extended pattern 170 via the opening 182 of the insulating layer 180 to be electrically connected to the drain D via the extended pattern 170. However, the invention is not limited thereto, and in other embodiments, the pixel electrode 120 can also be electrically connected to the drain D via other methods.

In the present embodiment, the gate-insulating layer GI covers the gate G, and the semiconductor pattern CH is disposed on the gate-insulating layer GI. In other words, the gate G is disposed below the semiconductor pattern CH, and the thin-film transistor T can be a bottom-gate thin-film transistor. However, the invention is not limited thereto, and in other embodiments, the thin-film transistor T can also be a top-gate thin-film transistor or other suitable types of thin-film transistors. In the present embodiment, the semiconductor pattern CH of the thin-film transistor T can be a single layer or a multilayer structure containing amorphous silicon, polysilicon, microcrystalline silicon, single-crystal silicon, organic semiconductor material, oxide semiconductor material (such as indium zinc oxide, indium gallium zinc oxide, other suitable materials, or a combination thereof), or other suitable materials, or a dopant is included in the materials, or a combination thereof.

The pixel array substrate 100 further includes a plurality of common lines 191 disposed on the first substrate 110. The common lines 191 are overlapped with a portion of the pixel electrode 120 to form a storage capacitor. The common lines 191 have a predetermined potential. The predetermined potential can be a ground potential, fixed potential, floating potential, adjustable potential, or other suitable potentials. In the present embodiment, the extending direction x of the common lines 191 can substantially be consistent with the extending direction x of the signal lines SL. In the present embodiment, the pixel array substrate 100 can further optionally include a plurality of common line branches 192 and 193, the extending direction y of the common line branches 192 and 193 can substantially be consistent with the extending direction y of the signal lines DL, the common line branches 192 and 193 are respectively disposed in correspondence to two opposite edges of the pixel electrode 120, and the common lines 191 are connected between the two opposite common line branches 192 and 193.

In the present embodiment, the common lines 191, the common line branches 192 and 193, the signal lines SL, and the gate G of the thin-film transistor T can optionally belong to the same first conductive layer, and the signal lines DL, the source S of the thin-film transistor T, the drain D of the thin-film transistor T, and the extended pattern 170 can optionally belong to the same second conductive layer, but the invention is not limited thereto. Based on consideration of conductivity, the first conductive layer and the second conductive layer generally adopt a metal material. However, the invention is not limited thereto, and in other embodiments, the first conductive layer and the second conductive layer can also adopt other conductive materials. Examples include alloy, nitride of a metal material, oxide of a metal material, oxynitride of a metal material, and stacked layers of metal materials and other conductive materials.

It should be mentioned that, at least one of the pixels P includes a pad 132 and a plurality of protrusions 142. The pad 132 is electrically connected to the signal lines DL. For instance, in the present embodiment, the pad 132 and the signal lines DL can belong to the same film layer. The signal line DL can be extended outward so as to connect the pad 132. The pad 132 can be a conductive pattern. A width W1 of the pad 132 in the direction x is greater than a width W2 of the signal lines DL in the same direction x. The plurality of protrusions 142 are spaced apart from one another, and can be arranged in the direction x intersected with the extending direction y of the signal lines DL. The pad 132 covers the plurality of protrusions 142. More specifically, in the present embodiment, the pad 132 covers an upper surface 142$s$1 of the protrusions 142 and a gap g1 between a plurality of adjacent protrusions 142. The pad 132 conformally covers the plurality of protrusions 142, but the invention is not limited thereto.

In the present embodiment, the material of the protrusions 142 can optionally be the same as the material of the semiconductor pattern CH of the thin-film transistor T. In other words, the protrusions 142 and the semiconductor pattern CH can be formed via the same process, and the protrusions 142 do not need to be formed via an additional process. However, the invention is not limited thereto, and in other embodiments, the protrusions 142 can also be formed with other members of the pixel array substrate 100, or be formed via an additional process.

At least one of the pixels P includes a pad 134 and a plurality of protrusions 144. The pad 134 is electrically connected to the signal lines SL. For instance, in the present embodiment, the pad 134 and the signal lines SL can belong to the same film layer. The signal line SL can be extended outward so as to connect the pad 134. The pad 134 can be a conductive pattern. A width W3 of the pad 134 in the direction y is greater than a width W4 of the signal lines SL in the same direction y. The plurality of protrusions 144 are spaced apart from one another, and can be arranged in the direction y intersected with the extending direction x of the signal lines SL. The pad 134 covers the plurality of protrusions 144. More specifically, in the present embodiment, the pad 134 covers an upper surface 144$s$1 of the protrusions 144 and a gap g2 between a plurality of adjacent protrusions 144. The pad 134 conformally covers the plurality of protrusions 144, but the invention is not limited thereto.

In the present embodiment, the pad 134 can optionally be formed with the gate G of the thin-film transistor in the same first conductive layer, and the protrusions 144 can be formed before the first conductive layer is formed. In other words, in the present embodiment, the protrusions 144 are formed via an additional process. However, the invention is not limited thereto, and in other embodiments, the protrusions 144 can also not be formed via an additional process. For instance, in another embodiment, if the thin-film transistor T is a top-gate thin-film transistor, and the pad 134 and the gate of the top-gate thin-film transistor are formed in the same film layer, then the protrusions 144 can also be formed with the semiconductor pattern of the top-gate thin-film transistor.

At least one of the pixels P includes a pad 136 and a plurality of protrusions 146. The pad 136 is electrically connected to the common lines 191. For instance, in the present embodiment, the pad 136 and the common lines 191 can belong to the same film layer. The common line 191 can be extended outward so as to connect the pad 136. The pad 136 can be a conductive pattern A width W5 of the pad 136 in the direction y is greater than a width W6 of the common lines 191 in the same direction y. The plurality of protrusions 146 are spaced apart from one another, and can be arranged in the direction y intersected with the extending direction x of the signal lines SL. The pad 136 covers the plurality of protrusions 146. More specifically, in the present embodiment, the pad 136 covers an upper surface 146$s$1 of the protrusions 146 and a gap g3 between a plurality of adjacent protrusions 146. The pad 136 conformally covers the plurality of protrusions 146, but the invention is not limited thereto.

In the present embodiment, the pad 136 can optionally be formed with the gate G of the thin-film transistor in the same first conductive layer. In the present embodiment, the protrusions 146 are formed before the first conductive layer is formed. In other words, in the present embodiment, the protrusions 146 are formed via an additional process. However, the invention is not limited thereto, and in other embodiments, the protrusions 146 can also be formed without an additional process. For instance, in another embodiment, if the thin-film transistor T is a top-gate thin-film transistor, and the pad 136 and the gate of the top-gate thin-film transistor are formed in the same film layer, then the protrusions 146 can also be formed with the semiconductor pattern of the top-gate thin-film transistor.

Figure 3:
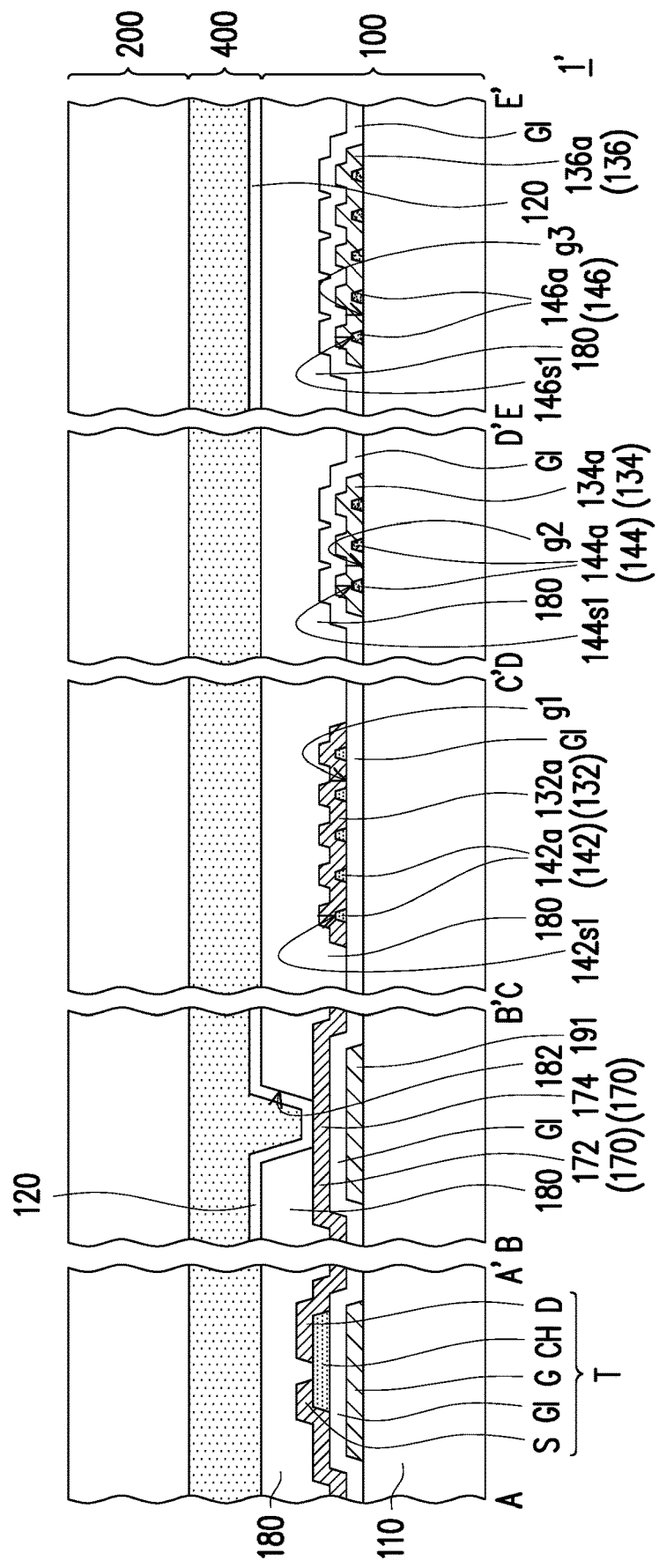
FIG. 3 is a cross section of a resized display apparatus 1' of an embodiment of the invention.
Figure 4:
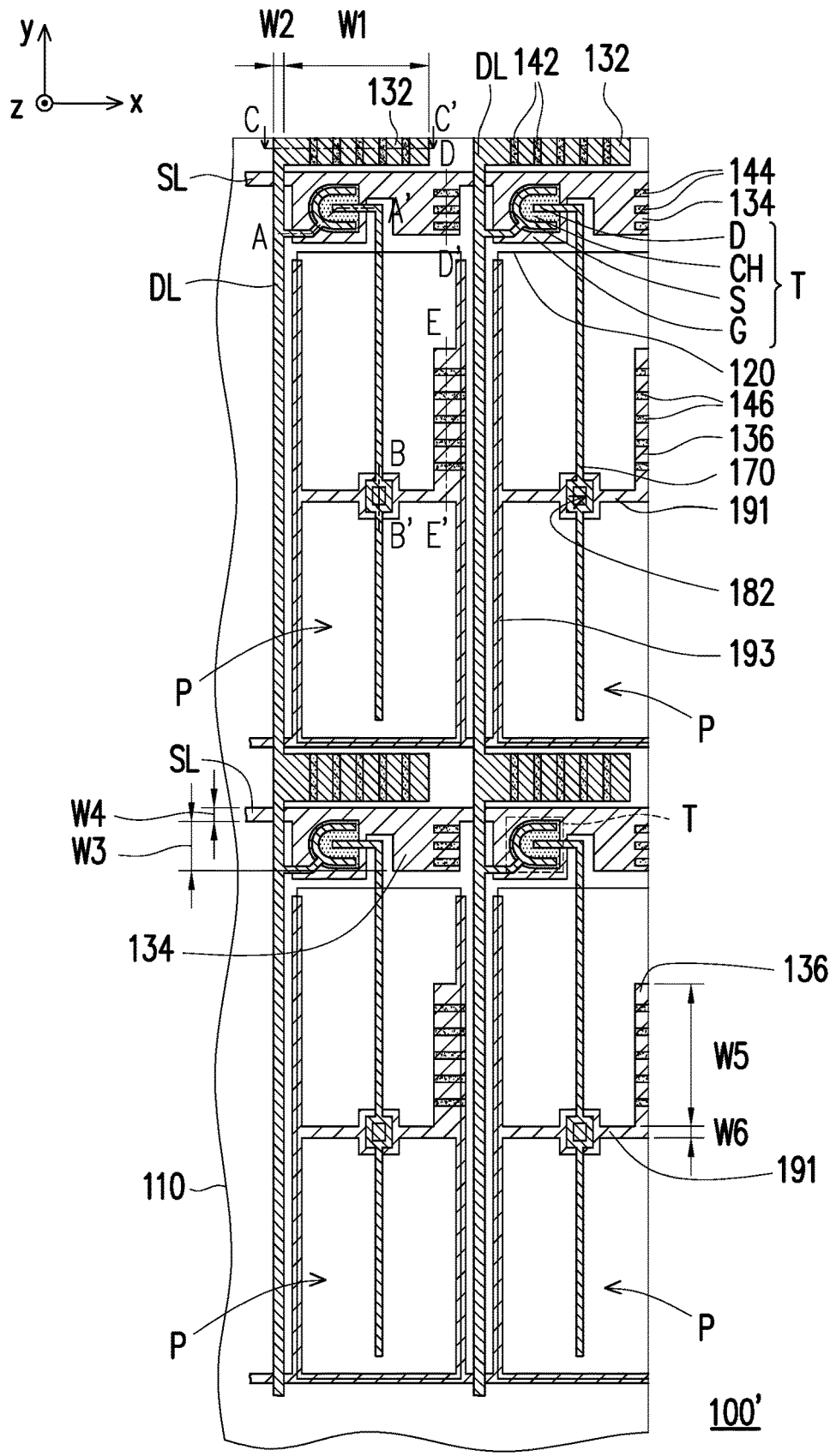
FIG. 4 is a top view of a pixel array substrate 100' of the resized display apparatus 1' of an embodiment of the invention.
Figure 5:
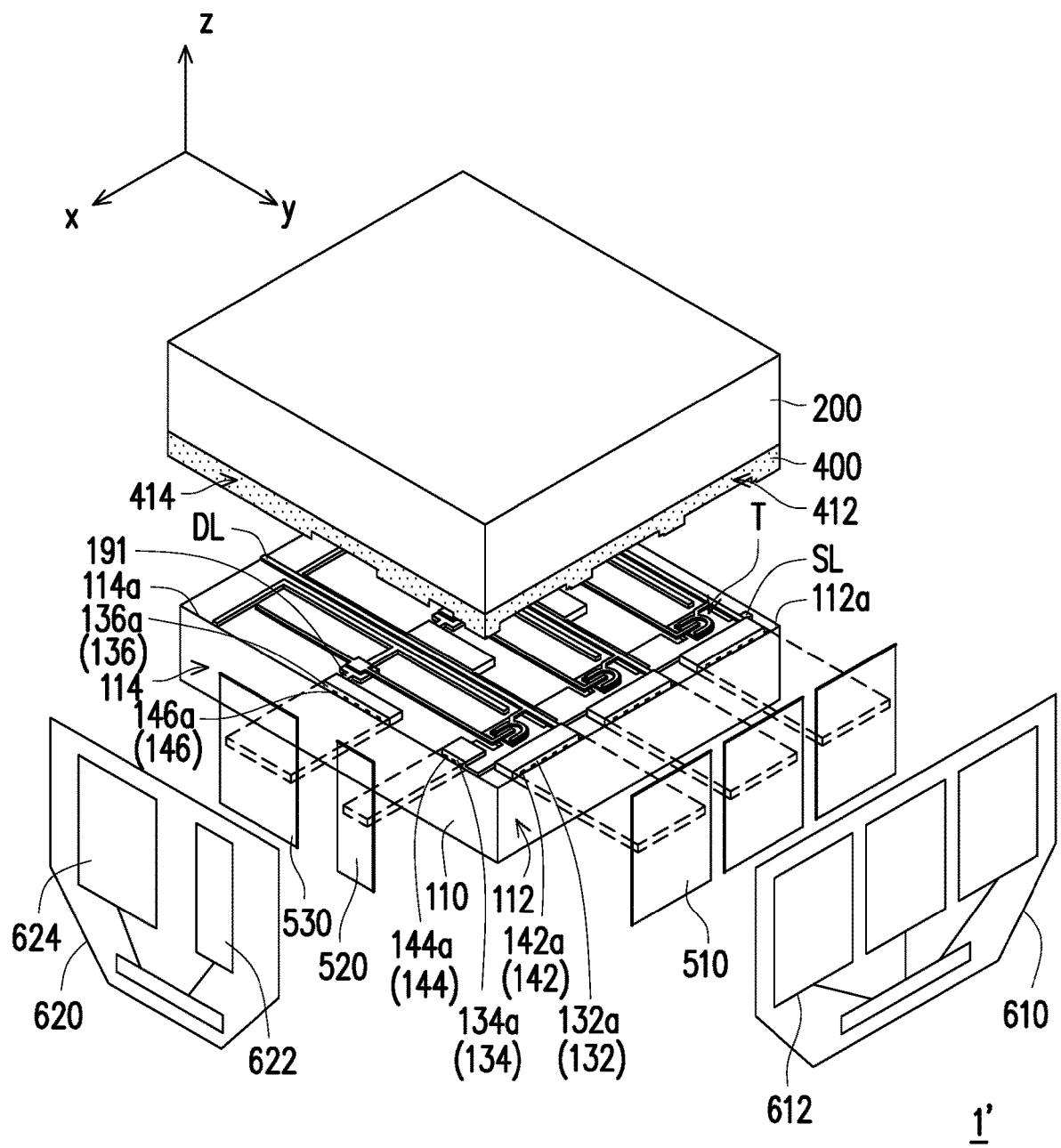
FIG. 5 is an exploded view of the resized display apparatus 1' of an embodiment of the invention.

FIG. 3 is a cross section of a resized display apparatus 1' of an embodiment of the invention. FIG. 4 is a top view of a pixel array substrate 100' of the resized display apparatus 1' of an embodiment of the invention. The cross section of the pixel array substrate 100' of FIG. 3 corresponds to section lines A-A', B-B', C-C', D-D', and E-E' of FIG. 4. FIG. 5 is an exploded view of the resized display apparatus 1' of an embodiment of the invention. For clarity, FIG. 5 omits the gate-insulating layer GI, the insulating layer 180, the pixel electrode 120, and the display medium 300. In the present embodiment, by cutting the display apparatus 1 above and filling the sealant 400 between the first substrate 110 and the second substrate 200 of the display apparatus 1 after cutting, the resized display apparatus 1' can be formed. Description is provided below with reference to FIG. 2 to FIG. 5.

Referring to FIG. 2 to FIG. 5, in the present embodiment, first, the display apparatus 1 including the pixel array substrate 100 can be cut along predetermined scribe lines 10 and 20 (labeled in FIG. 2). Next, the sealant 400 (shown in FIG. 3 and FIG. 5) is filled between the first substrate 110 and the second substrate 200. A portion of the sealant 400 is permeated between the first substrate 110 and the second substrate 200 and arranged along the scribe lines 10 and 20 and overlapped with the plurality of pixels P near the scribe lines 10 and 20. Next, the pixel array substrate 100 and the sealant 400 are polished to form a side wall 112 (labeled in FIG. 5) of the first substrate 110 and a side wall 412 (labeled in FIG. 5) of the sealant 400 corresponding to the scribe line 10, and a side wall 114 (labeled in FIG. 5) of the first substrate 110 and a side wall 414 (labeled in FIG. 5) of the sealant 400 corresponding to the scribe line 20.

In the polishing process above, the pixel array substrate 100 and the sealant 400 can be polished together, and therefore a side wall 132$a$ of the pad 132 arranged along the scribe line 10 and near the scribe line 10 and a side wall 142$a$ of the protrusions 142 can substantially be aligned with the side wall 112 of the first substrate 110 and the side wall 412 of the sealant 400. The side wall 112 of the first substrate 110 has an edge 112a intersected with the extending direction y of the signal lines SL, and the plurality of protrusions 142 are arranged along the edge 112a. The width W1 (labeled in FIG. 4) of the pad 132 on the edge 112a is greater than the width W2 (labeled in FIG. 4) of the signal lines DL on the edge 112a (labeled in FIG. 5).

Similarly, in the polishing process above, the pixel array substrate 100 and the sealant 400 are polished together, and therefore a side wall 134a of the pad 134 of the pixels P arranged along the scribe line 20 and near the scribe line 20 and a side wall 144a of the protrusions 144 are substantially aligned with the side wall 114 of the first substrate 110 and the side wall 414 of the sealant 400; and a side wall 136a of the pad 136 of the pixels P arranged along the scribe line 20 and near the scribe line 20 and a side wall 146a of the protrusions 146 are substantially aligned with the side wall 114 of the first substrate 110 and the side wall 414 of the sealant 400. The side wall 114 of the first substrate 110 has an edge 114a intersected with the extending direction x of the signal lines SL, and the plurality of protrusions 134 and 136 are arranged along the edge 114a (labeled in FIG. 5). The width W3 (labeled in FIG. 4) of the pad 134 on the edge 114a is greater than the width W4 (labeled in FIG. 4) of the signal lines SL on the edge 114a. The width W5 (labeled in FIG. 4) of the pad 136 on the edge 114a is greater than the width W6 (labeled in FIG. 4) of the common lines 191 on the edge 114a.

Next, a conductive pattern 510 is disposed on the side wall 112 of the first substrate 110, wherein the conductive pattern 510 is in contact with the side wall 132a of the pad 132 and the side wall 142a of the protrusions 142 such that the conductive pattern 510 can be electrically connected to the signal lines DL via the pad 132; conductive patterns 520 and 530 are disposed on the side wall 114 of the first substrate 110, wherein the conductive pattern 520 is in contact with the side wall 134a of the pad 134 and the side wall 144a of the protrusions 144 such that the conductive pattern 520 can be electrically connected to the signal lines SL via the pad 134, and the conductive pattern 530 is in contact with the side wall 136a of the pad 136 and the side wall 146a of the protrusions 146 such that the conductive pattern 530 can be electrically connected to the common lines 191 via the pad 136.

In the present embodiment, the conductive patterns 510, 520, and 530 are, for instance, formed by patterning a metal layer via laser. However, the invention is not limited thereto, and in other embodiments, the conductive patterns 510, 520, and 530 can also be formed via inkjet printing, flexo printing, gravure printing, or other suitable methods.

Next, a flexible circuit board 610 is bonded to the conductive pattern 510 located on the side wall 112 of the first substrate 110 such that an electrode 612 of the flexible circuit board 610 is electrically connected to the pad 132 via the conductive pattern 510; and a flexible circuit board 620 is bonded to the conductive patterns 520 and 530 located on the side wall 114 of the first substrate 110 such that electrodes 622 and 624 of the flexible circuit board 620 are respectively electrically connected to the pads 134 and 136 via the conductive patterns 520 and 530. At this point, the resized display apparatus 1' is complete. For instance, in the present embodiment, the bonding process can adopt a hot-pressing process, but the invention is not limited thereto.

Figure 6:
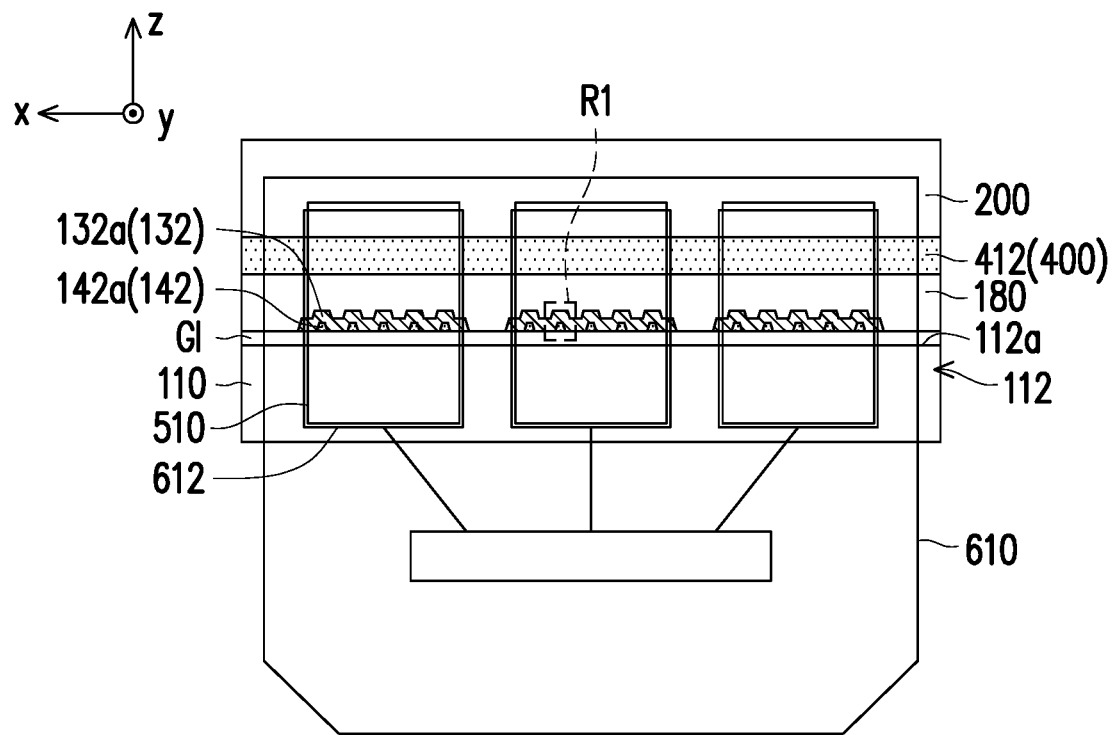
FIG. 6 is a side view of the resized display apparatus 1' of an embodiment of the invention.

FIG. 6 is a side view of the resized display apparatus 1' of an embodiment of the invention. Referring to FIG. 5 and FIG. 6, by disposing the pad 132 on the protrusions 142, when the pixel array substrate 100 is polished in the resizing process, the cross-sectional area of the pad 132 formed by polishing (i.e., the area of the side wall 132a) is greater. Accordingly, when the conductive pattern 510 is formed on the side wall 112 of the first substrate 110, the contact area between the conductive pattern 510 and the side wall 132a of the pad 132 is greater and the contact resistance is smaller, and therefore the reliability of the display apparatus 1' is increased.

Figure 7:
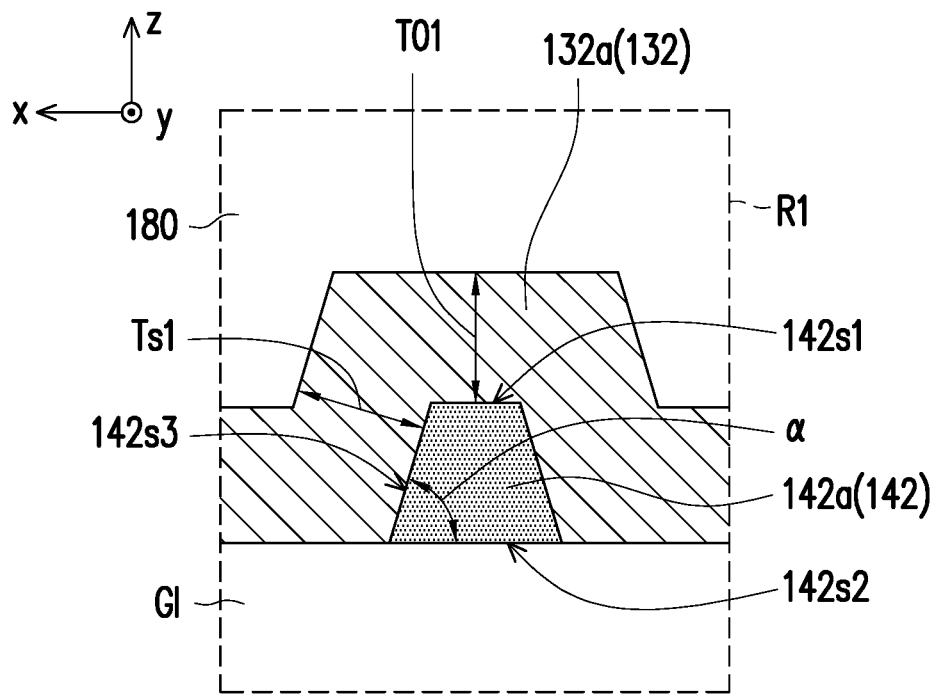
FIG. 7 is an enlarged view of a region R1 of the cross section of the pixel array substrate of FIG. 6.

FIG. 7 is an enlarged view of a region R1 of the cross section of the pixel array substrate of FIG. 6. Referring to FIG. 6 and FIG. 7, for instance, in the present embodiment, the protrusions 142 have an upper surface 142s1 distant from the first substrate 110, a bottom surface 142s2 opposite to the upper surface 142s1, and a side wall 142s3 connected between the upper surface 142s1 and the bottom surface 142s2, and an angle $\alpha$ is between the bottom surface 142s2 and the side wall 142s3 of the protrusions 142; the thickness of a portion of the pad 132 located on the upper surface 142s1 of the protrusions 142 is T01; the thickness of a portion of the pad 132 located on the side wall 142s3 of the protrusions 142 is Ts1; and the thicknesses T01 and Ts1 of the pad 132 and the angle $\alpha$ of the protrusions 142 satisfy formula (1): $(Ts1/T01) > \cos \alpha$. A pad (not shown) of a comparative example is directly disposed on the gate-insulating layer GI and has the same vertical projection area as the pad 132. In the present embodiment, when the thicknesses T01 and Ts1 of the pad 132 and the angle $\alpha$ of the protrusions 141 satisfy formula (1) above, the pad 132 disposed on the protrusions 142 has a greater cross-sectional area than the pad (not shown) of the comparative example.

Figure 8:
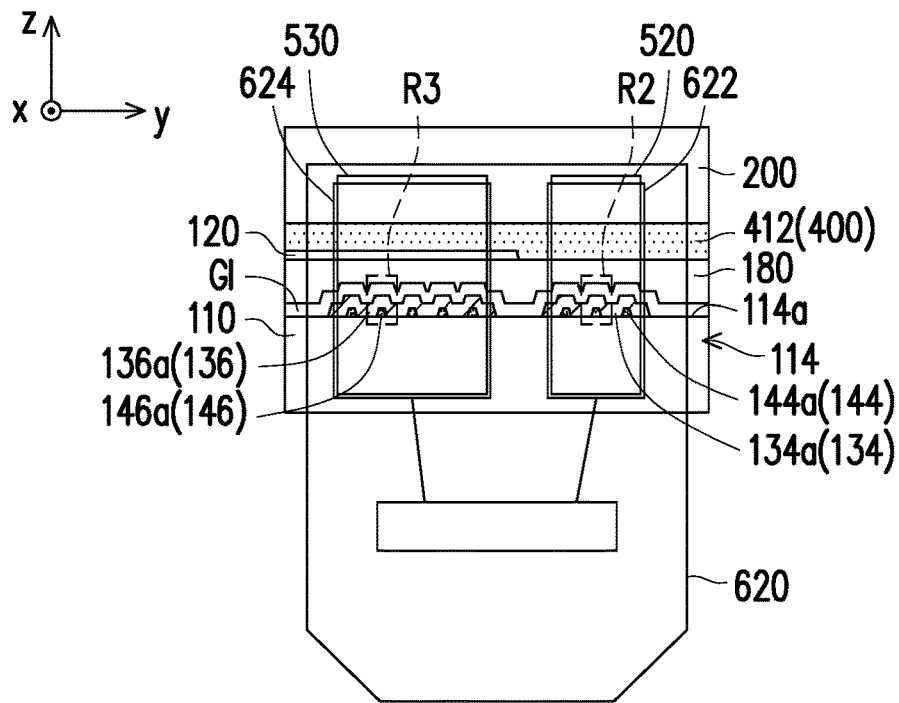
FIG. 8 is another side view of the resized display apparatus 1' of an embodiment of the invention.

FIG. 8 is another side view of the resized display apparatus 1' of an embodiment of the invention. Referring to FIG. 5 and FIG. 8, similarly, by disposing the pad 134 on the protrusions 144, when the pixel array substrate 100 is polished in the resizing process, the cross-sectional area of the pad 134 formed by polishing (i.e., the area of the side wall 134a) is greater. Accordingly, when the conductive pattern 520 is formed on the side wall 114 of the first substrate 110, the contact area between the conductive pattern 520 and the side wall 134a of the pad 134 can be increased and the contact resistance is smaller, and therefore the reliability of the display apparatus 1' is increased.

Figure 9:
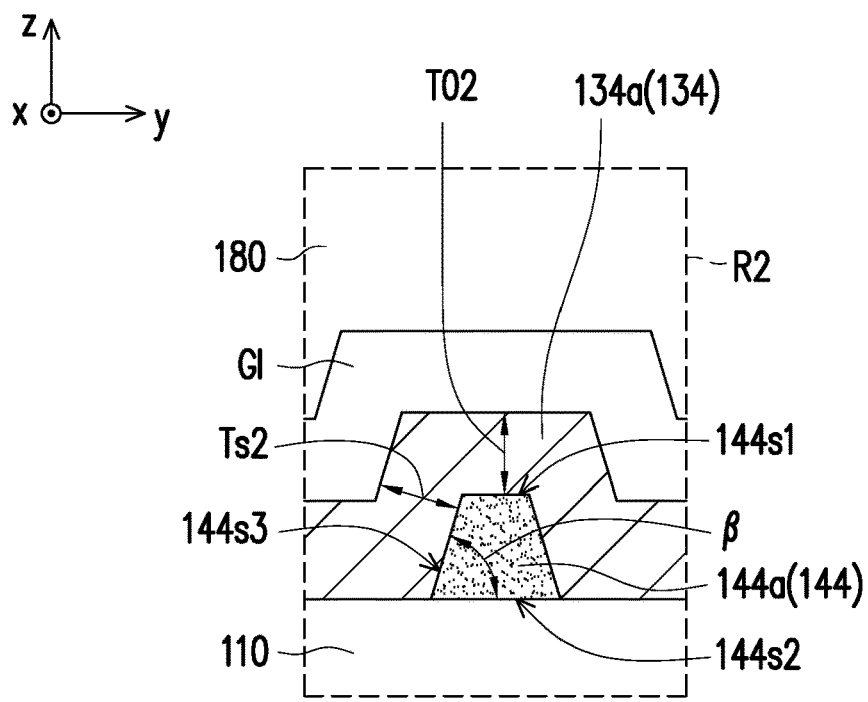
FIG. 9 is an enlarged view of a region R2 of the cross section of the pixel array substrate of FIG. 8.

FIG. 9 is an enlarged view of a region R2 of the cross section of the pixel array substrate of FIG. 8. Referring to FIG. 8 and FIG. 9, for instance, in the present embodiment, the protrusions 144 have an upper surface 144s1 distant from the first substrate 110, a bottom surface 144s2 opposite to the upper surface 144s1, and a side wall 144s3 connected between the upper surface 144s1 and the bottom surface 144s2, and an angle $\beta$ is between the bottom surface 144s2 and the side wall 144s3 of the protrusions 144, the thickness of a portion of the pad 134 located on the upper surface 144s1 of the protrusions 144 is T02, the thickness of a portion of the pad 134 located on the side wall 144s3 of the protrusions 144 is Ts2, and the thicknesses T02 and Ts2 of the pad 134 and the angle $\beta$ of the protrusions 144 satisfy formula (2): $(Ts2/T02) > \cos \beta$. When a pad (not shown) of a comparative example is directly disposed on the first substrate 110 and has the same vertical projection area as the pad 134 and the thicknesses T02 and Ts2 of the pad 134 and the angle $\beta$ of the protrusions 144 satisfy formula (2) above, the pad 134 disposed on the protrusions 144 has a greater cross-sectional area than the pad of the comparative example.

Referring to FIG. 5 and FIG. 8, similarly, by disposing the pad 136 on the protrusions 146, when the pixel array substrate 100 is polished in the resizing process, the cross-sectional area of the pad 136 formed by polishing (i.e., the area of the side wall 136a) is greater. Accordingly, when the conductive pattern 530 is formed on the side wall 114 of the first substrate 110, the contact area between the conductive pattern 530 and the side wall 136a of the pad 136 is increased and the contact resistance is smaller, and therefore the reliability of the display apparatus 1' is increased.

Figure 10:
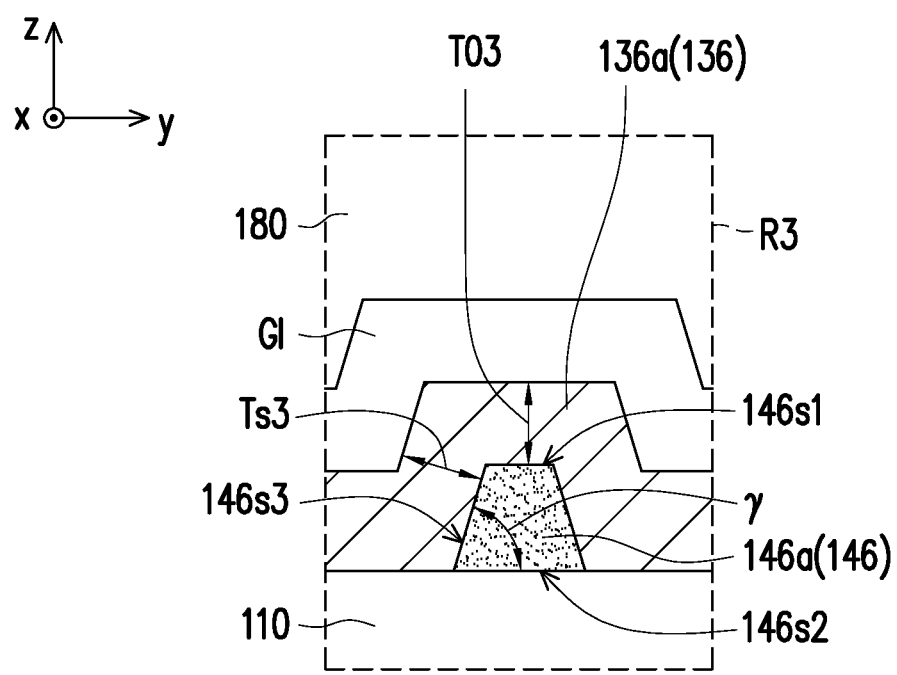
FIG. 10 is an enlarged view of a region R3 of the cross section of the pixel array substrate of FIG. 8.

FIG. 10 is an enlarged view of a region R3 of the cross section of the pixel array substrate of FIG. 8. Referring to FIG. 8 and FIG. 10, for instance, in the present embodiment, the protrusions 146 have an upper surface 146s1 distant from the first substrate 110, a bottom surface 146s2 opposite to the upper surface 146s1, and a side wall 146s3 connected between the upper surface 146s1 and the bottom surface 146s2, an angle γ is between the bottom surface 146s2 and the side wall 146s3 of the protrusions 146, the thickness of a portion of the pad 136 located on the upper surface 146s1 of the protrusions 146 is T03, the thickness of a portion of the pad 136 located on the side wall 146s3 of the protrusions 146 is Ts3, and the thicknesses T03 and Ts3 of the pad 136 and the angle γ of the protrusions 146 satisfy formula (3): (Ts3/T03)>cos γ. When a pad (not shown) of a comparative example is directly disposed on the first substrate 110 and has the same vertical projection area as the pad 136 and the thicknesses T03 and Ts3 of the pad 136 and the angle γ of the protrusions 146 satisfy formula (3) above, the pad 136 disposed on the protrusions 146 has a greater cross-sectional area than the pad of the comparative example.

Figure 11:
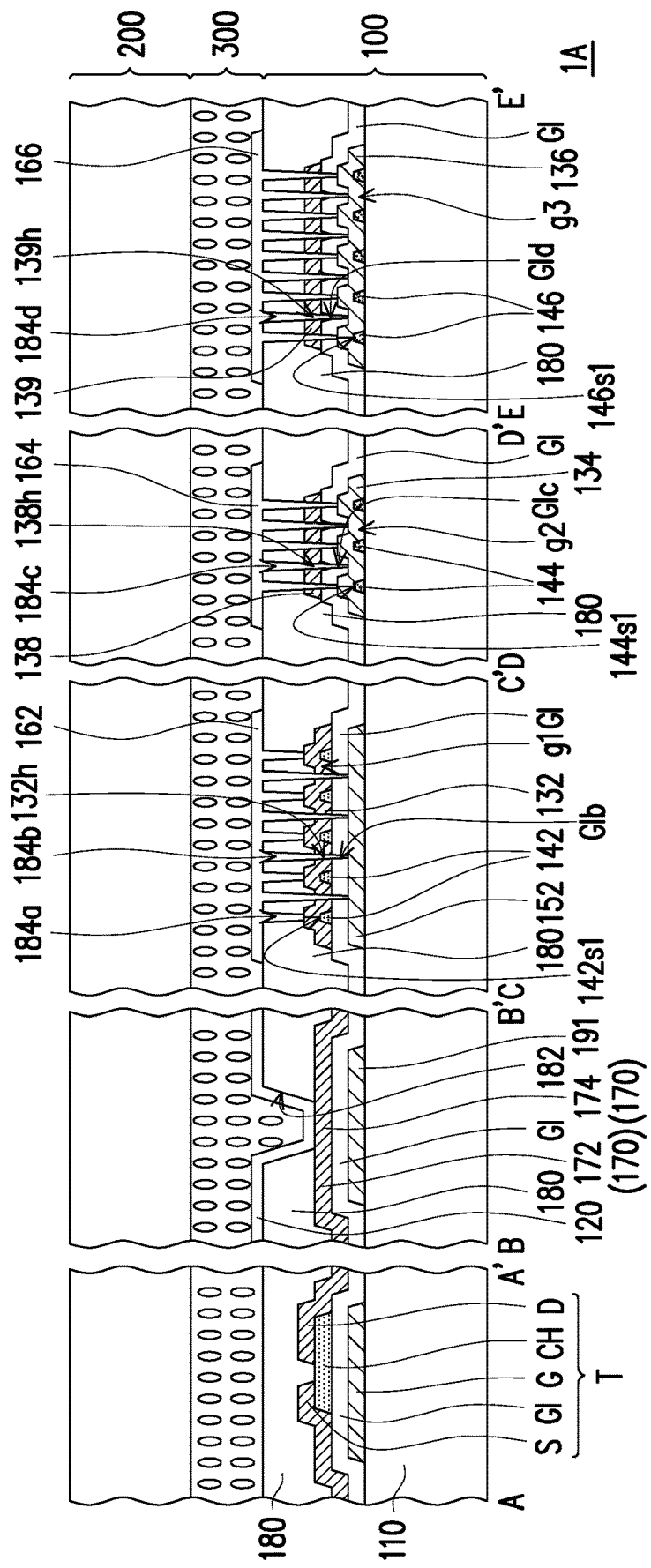
FIG. 11 is a cross section of an unresized display apparatus 1A of another embodiment of the invention.
Figure 12:
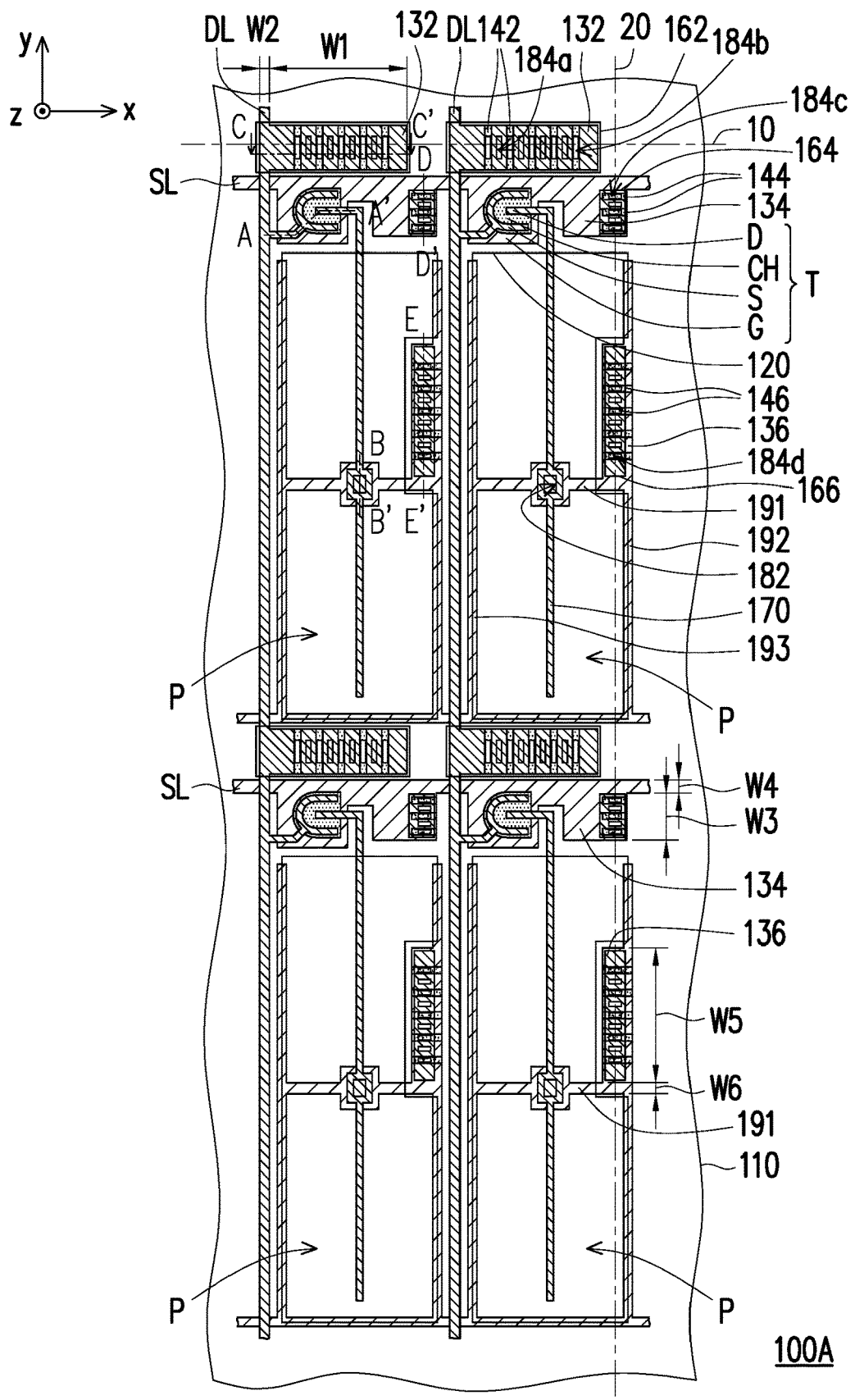
FIG. 12 is a top view of a pixel array substrate 100A of the unresized display apparatus 1A of another embodiment of the invention.

FIG. 11 is a cross section of an unresized display apparatus 1A of another embodiment of the invention. FIG. 12 is a top view of a pixel array substrate 100A of the unresized display apparatus 1A of another embodiment of the invention. In particular, the cross section of the pixel array substrate 100A of FIG. 11 corresponds to section lines A-A', B-B', C-C', D-D', and E-E' of FIG. 12. A display apparatus 1A of the present embodiment is similar to the display apparatus 1 above, and the differences between the two are as follows.

Referring to FIG. 11 and FIG. 12, the pixel array substrate 100A of the display apparatus 1A further includes an auxiliary conductive pattern 152 (shown in FIG. 11) overlapped with the pad 132 and located on the predetermined scribe line 10. In the present embodiment, the auxiliary conductive pattern 152 and the gate G of the thin-film transistor can be formed in the same film layer, and the auxiliary conductive pattern 152 can be located below the pad 132. The auxiliary conductive pattern 152 is electrically connected to the pad 132 and electrically isolated from the gate G and the signal lines SL. Referring to FIG. 12, the auxiliary conductive pattern 152 can be electrically connected to the pad 132 via a portion of an auxiliary conductive pattern 162 disposed in an opening 132h, an opening GIb, an opening 184a, and an opening 184b. For instance, in the present embodiment, the opening 184a, the opening 184b, the opening 132h overlapped with the opening 184b, and the opening GIb overlapped with the opening 132h can be optionally disposed on the scribe line 10, but the invention is not limited thereto.

The pixel array substrate 100A of the display apparatus 1A further includes the auxiliary conductive pattern 162 overlapped with the pad 132 and located on the predetermined scribe line 10. In the present embodiment, the auxiliary conductive pattern 162 and the pixel electrode 120 can be formed in the same film layer, and the auxiliary conductive pattern 162 can be located above the pad 132. The auxiliary conductive pattern 162 is electrically connected to the pad 132 and electrically isolated from the pixel electrode 120. For instance, in the present embodiment, the auxiliary conductive pattern 162 can be disposed in the openings 184a and 184b of the insulating layer 180, the opening 132h of the pad 132, and the opening GIb of the gate-insulating layer GI, and the auxiliary conductive pattern 162 can be electrically connected to the pad 132 via the openings 184a and 184b of the insulating layer 180. In the present embodiment, the auxiliary conductive pattern 162 can further be electrically connected to the auxiliary conductive pattern 152 via the opening 184b of the insulating layer 180, the opening 132h of the pad 132, and the opening GIb of the gate-insulating layer GI. However, the invention is not limited thereto, and in other embodiments, the auxiliary conductive pattern 162 can also be electrically connected to the pad 132 via other methods.

The pixel array substrate 100A of the display apparatus 1A can further include an auxiliary conductive pattern 164 overlapped with the pad 134 and located on the predetermined scribe line 20. In the present embodiment, the auxiliary conductive pattern 164 and the pixel electrode 120 can be formed in the same film layer, and the auxiliary conductive pattern 164 can be located above the pad 134. The auxiliary conductive pattern 164 is electrically connected to the pad 134 and electrically isolated from the pixel electrode 120.

The pixel array substrate 100A of the display apparatus 1A can further include an auxiliary conductive pattern 138 overlapped with the pad 134 and located on the predetermined scribe line 20. In the present embodiment, the auxiliary conductive pattern 138 and the signal lines DL can be formed in the same film layer, and the auxiliary conductive pattern 138 can be located between the pad 134 and the auxiliary conductive pattern 164. The auxiliary conductive pattern 138 is electrically connected to the pad 134 and electrically isolated from the signal lines DL.

For instance, in the present embodiment, the auxiliary conductive pattern 164 can be electrically connected to the pad 134 via an opening 184c of the insulating layer 180, an opening 138h of the auxiliary conductive pattern 138, and an opening GIc of the gate-insulating layer GI. The auxiliary conductive pattern 138 can be electrically connected to the pad 134 via a portion of the auxiliary conductive pattern 164 located in the opening 138h of the auxiliary conductive pattern 138 and the opening GIc of the gate-insulating layer GI.

The pixel array substrate 100A of the display apparatus 1A can further include an auxiliary conductive pattern 166 overlapped with the pad 136 and located on the predetermined scribe line 20. In the present embodiment, the auxiliary conductive pattern 166 and the pixel electrode 120 can be formed in the same film layer, and the auxiliary conductive pattern 166 can be located above the pad 136. The auxiliary conductive pattern 164 is electrically connected to the pad 136 and electrically isolated from the pixel electrode 120.

The pixel array substrate 100A of the display apparatus 1A can further include an auxiliary conductive pattern 139 overlapped with the pad 136 and located on the predetermined scribe line 20. In the present embodiment, the auxiliary conductive pattern 139 and the signal lines DL can be formed in the same film layer, and the auxiliary conductive pattern 139 can be located between the pad 136 and the auxiliary conductive pattern 166. The auxiliary conductive pattern 139 is electrically connected to the pad 134 and electrically isolated from the signal lines DL.

For instance, in the present embodiment, the auxiliary conductive pattern 166 can be electrically connected to the pad 136 via an opening 184d of the insulating layer 180, an opening 139h of the auxiliary conductive pattern 139, and an opening GId of the gate-insulating layer GI. The auxiliary conductive pattern 139 can be electrically connected to the pad 136 via a portion of the auxiliary conductive pattern 166 located in the opening 139h of the auxiliary conductive pattern 139 and the opening GId of the gate-insulating layer GI.

Figure 13:
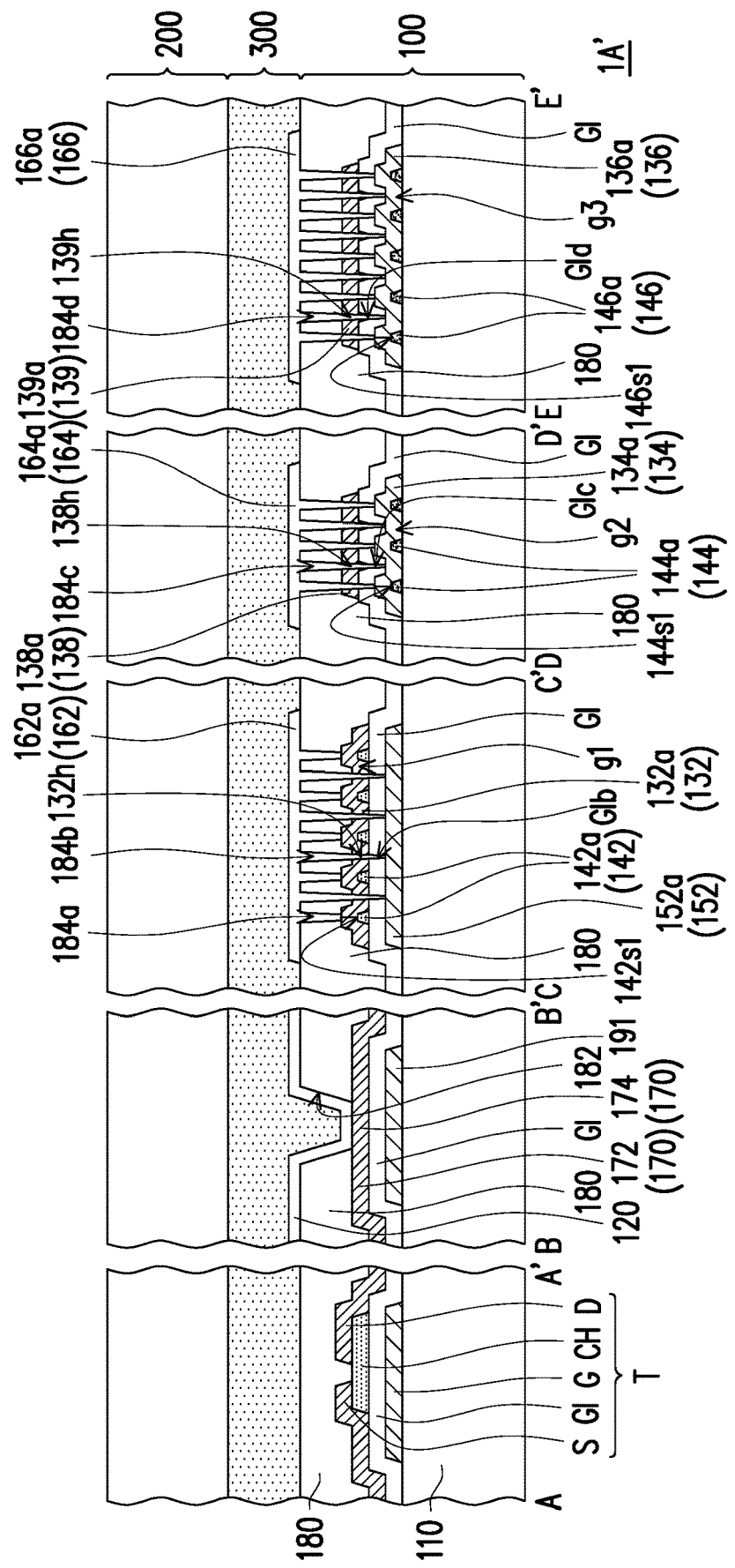
FIG. 13 is a cross section of a resized display apparatus 1A' of another embodiment of the invention.
Figure 14:
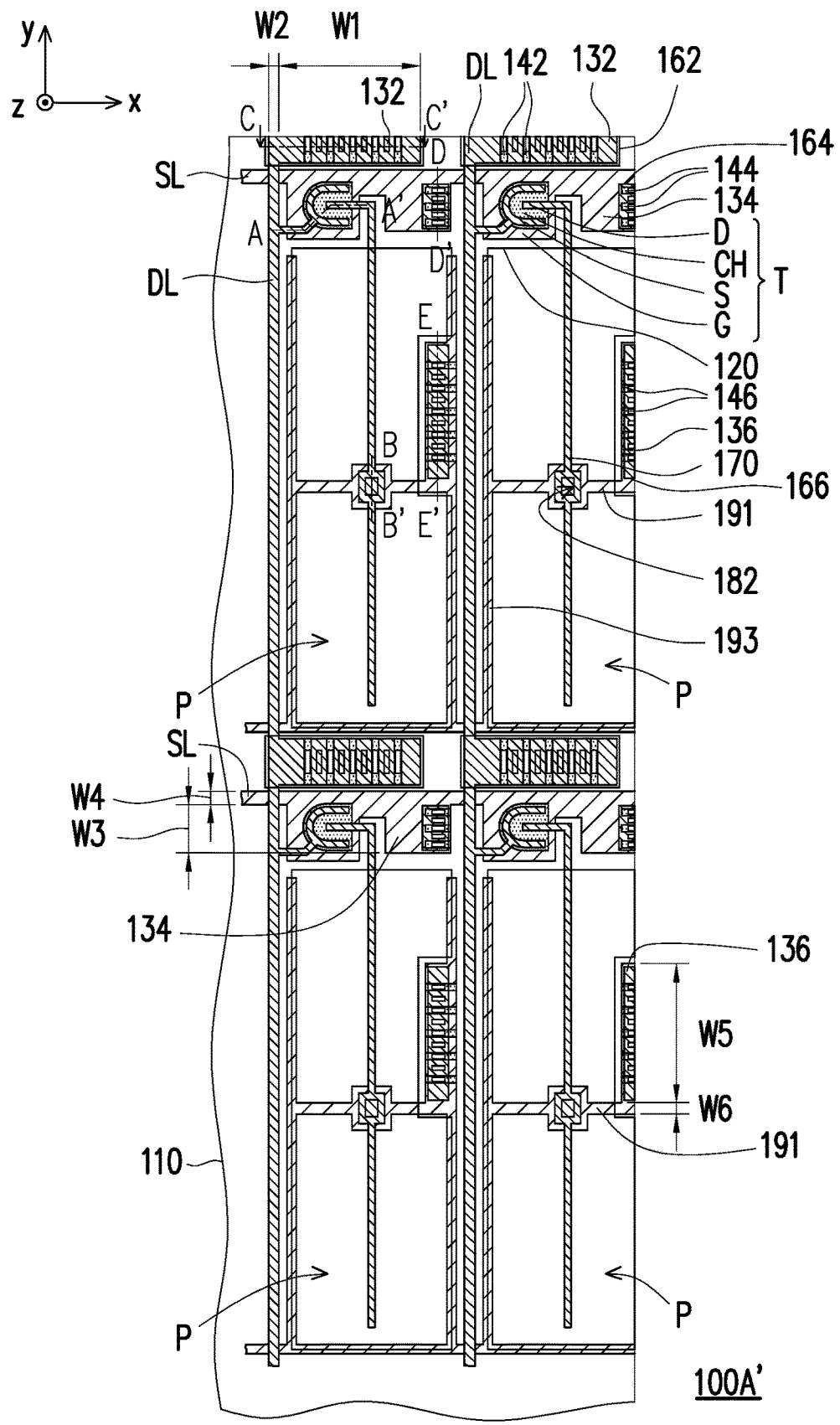
FIG. 14 is a top view of a pixel array substrate 100A' of the resized display apparatus 1A' of another embodiment of the invention.
Figure 15:
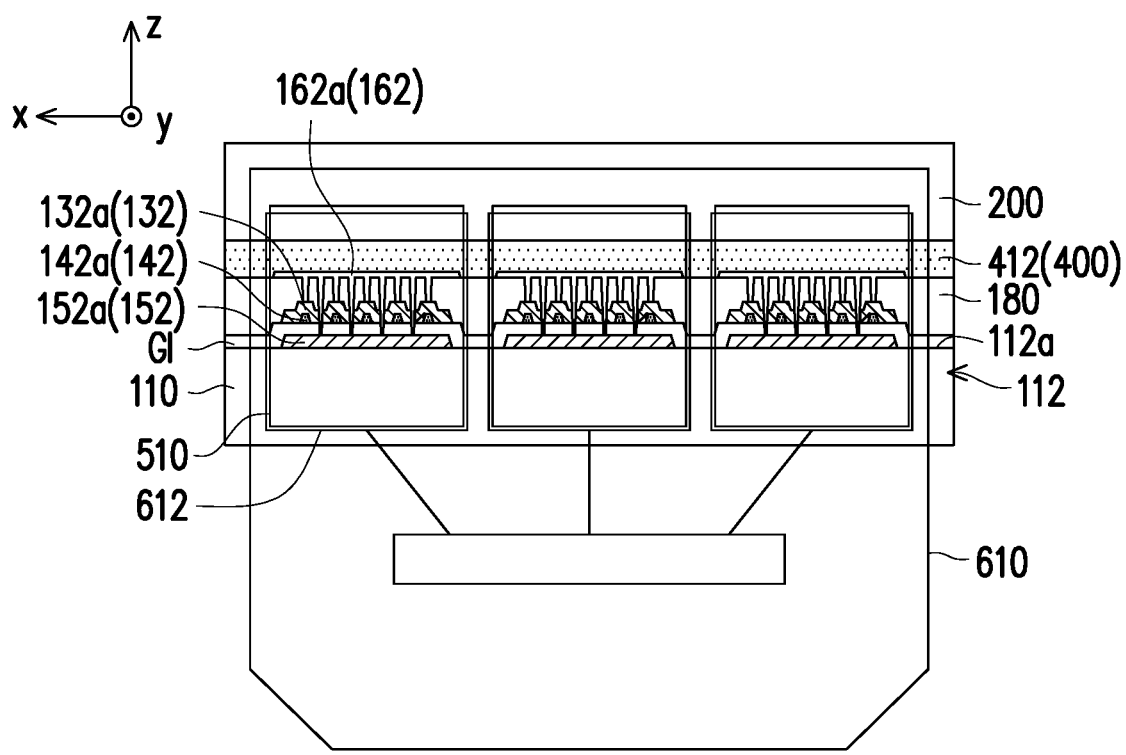
FIG. 15 is a side view of the resized display apparatus 1A' of another embodiment of the invention.
Figure 16:
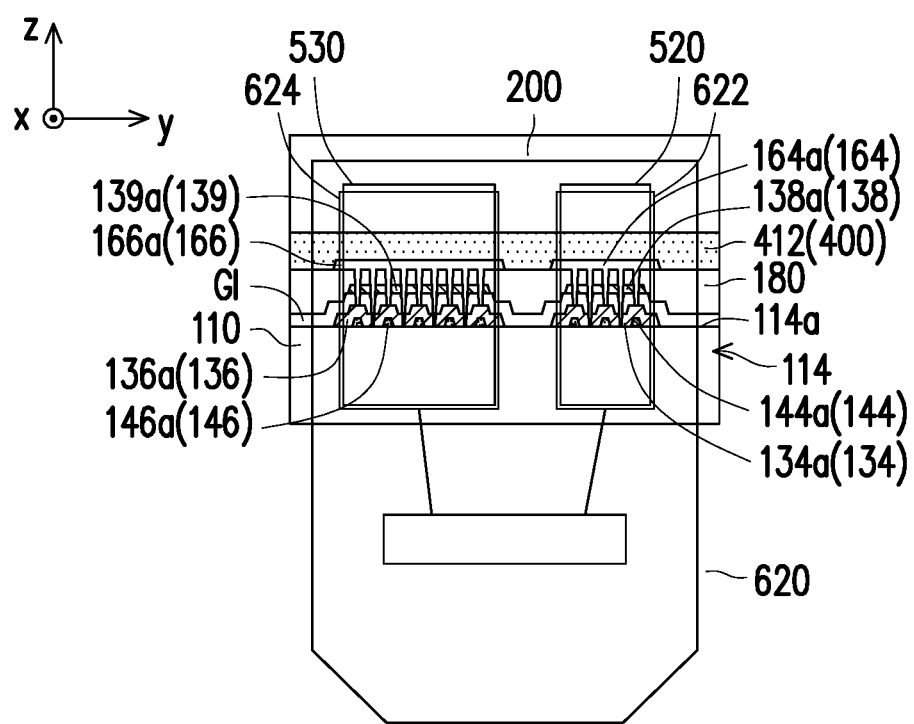
FIG. 16 is another side view of the resized display apparatus 1A' of another embodiment of the invention.

FIG. 13 is a cross section of a resized display apparatus 1A' of another embodiment of the invention. FIG. 14 is a top view of a pixel array substrate 100A' of the resized display apparatus 1A' of another embodiment of the invention. FIG. 15 is a side view of the resized display apparatus 1A' of another embodiment of the invention. FIG. 16 is another side view of the resized display apparatus 1A' of another embodiment of the invention.

Referring to FIG. 13, FIG. 14, FIG. 15, and FIG. 16, similarly, by cutting the display apparatus 1A above and filling the sealant 400 between the first substrate 110 and the second substrate 200 of the display apparatus 1A after cutting, the resized display apparatus 1A' can be formed. The method of forming the resized display apparatus 1A' is similar to the embodiments above and can be implemented by those having ordinary skill in the art based on the descriptions above, and is therefore not repeated herein.

Referring to FIG. 13, FIG. 14, and FIG. 15, one difference from the process of the display apparatus 1' is that, in the polishing process of the pixel array substrate 100A, in addition to the pad 132 and the plurality of protrusions 142, the auxiliary conductive patterns 152 and 162 electrically connected to the pad 132 are also polished, and as a result side walls 152a and 162a aligned with the side wall 112 of the first substrate 110 are formed. Accordingly, when the conductive pattern 510 is formed on the side wall 112 of the first substrate 110, in comparison to the conductive pattern 510 of the display apparatus 1', the area of electrical contact between the conductive pattern 510 of the display apparatus 1A' of the present embodiment and the pixel array substrate 100A further includes the areas of the side walls 152a and 162a of the auxiliary conductive patterns 152 and 162. Accordingly, contact resistance can be further reduced, and the reliability of the display apparatus 1A' can be increased.

Referring to FIG. 13, FIG. 14, and FIG. 16, another difference from the process of the display apparatus 1' is that, in the polishing process of the pixel array substrate 100A, in addition to the pads 134 and 136 and the plurality of protrusions 144 and 146, the auxiliary conductive patterns 138, 164, 139, and 166 electrically connected to the pads 134 and 136 are also polished, and as a result side walls 138a, 164a, 139a, and 166a aligned with the side wall 114 of the first substrate 110 are formed. Accordingly, when the conductive patterns 520 and 530 are formed on the side wall 114 of the first substrate 110, in comparison to the conductive patterns 520 and 530 of the display apparatus 1', the area of electrical contact between the conductive patterns 520 and 530 of the display apparatus 1A' of the present embodiment and the pixel array substrate 100A further includes the areas of the side walls 138a, 164a, 139a, and 166a of the auxiliary conductive patterns 138, 164, 139, and 166. Accordingly, contact resistance can be further reduced, and the reliability of the display apparatus 1A' is increased.

It should be mentioned that, in the present embodiment, the pixel array substrates 100A and 100A' include all of the pad 132, the auxiliary conductive pattern 152, and the auxiliary conductive pattern 162, the pixel array substrates 100A and 100A' include all of the pad 134, the auxiliary conductive pattern 138, and the auxiliary conductive pattern 164, and the pixel array substrates 100A and 100A' include all of the pad 136, the auxiliary conductive pattern 139, and the auxiliary conductive pattern 166. However, the invention is not limited thereto, and in an embodiment, the display apparatuses 1A and 1A' can omit the auxiliary conductive pattern 152 or the auxiliary conductive pattern 162, the auxiliary conductive pattern 138 or the auxiliary conductive pattern 164, or the auxiliary conductive pattern 139 or the auxiliary conductive pattern 166, and the resulting variety of display apparatuses are also within the scope of the invention.

Figure 17:
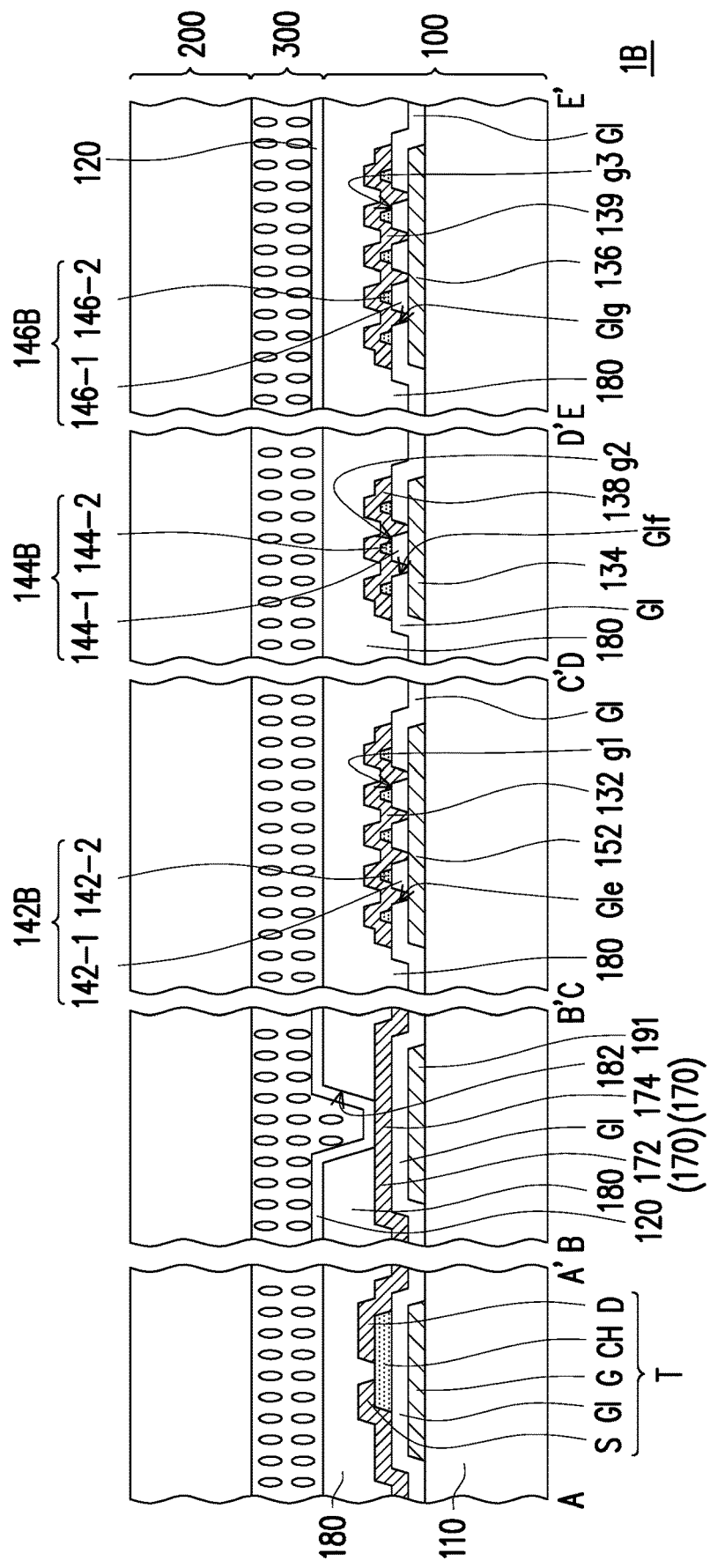
FIG. 17 is a cross section of an unresized display apparatus 1B of yet another embodiment of the invention.
Figure 18:
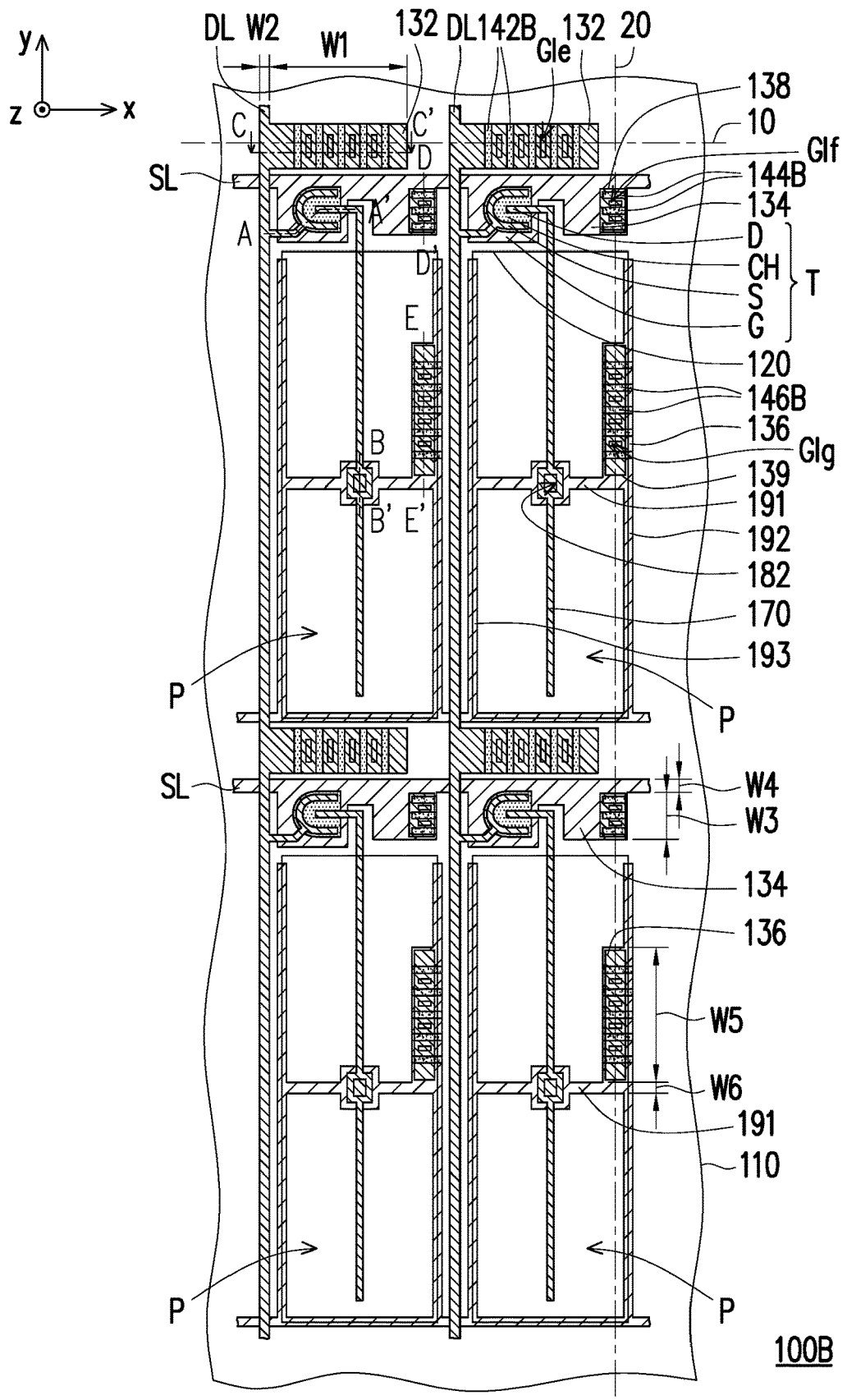
FIG. 18 is a top view of a pixel array substrate 100B of the unresized display apparatus 1B of yet another embodiment of the invention.

FIG. 17 is a cross section of an unresized display apparatus 1B of yet another embodiment of the invention. FIG. 18 is a top view of a pixel array substrate 100B of the unresized display apparatus 1B of yet another embodiment of the invention. In particular, the cross section of the pixel array substrate 100B of FIG. 17 corresponds to section lines A-A', B-B', C-C', D-D', and E-E' of FIG. 18. A display apparatus 1B of the present embodiment is similar to the display apparatus 1A above, and one difference between the two is that the pixel array substrate 100B of the display apparatus 1B omits the auxiliary conductive patterns 162, 164, and 166 of the pixel array substrate 100A of the display apparatus 1A; the pad 132 can be electrically connected to the auxiliary conductive pattern 152 via an opening GIe of the gate-insulating layer GI, and the opening GIe of the gate-insulating layer GI can be on the scribe line 10; the auxiliary conductive pattern 138 can be electrically connected to the pad 134 via an opening GIf of the gate-insulating layer GI, and the opening GIf of the gate-insulating layer GI can be on the scribe line 10; and the auxiliary conductive pattern 139 can be electrically connected to the pad 136 via an opening GIg of the gate-insulating layer GI, and the opening GIg of the gate-insulating layer GI can be on the scribe line 10.

Figure 19:
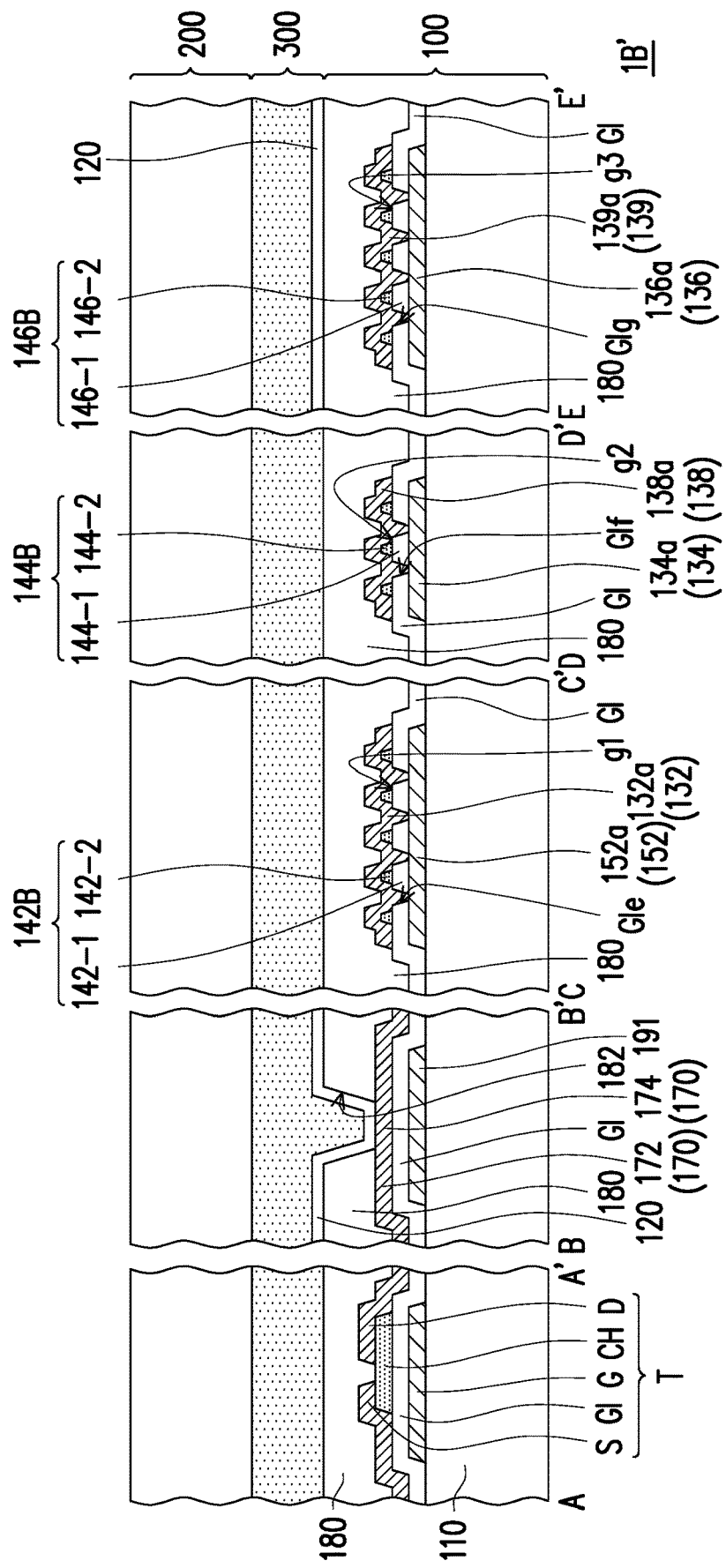
FIG. 19 is a cross section of a resized display apparatus 1B' of yet another embodiment of the invention.
Figure 20:
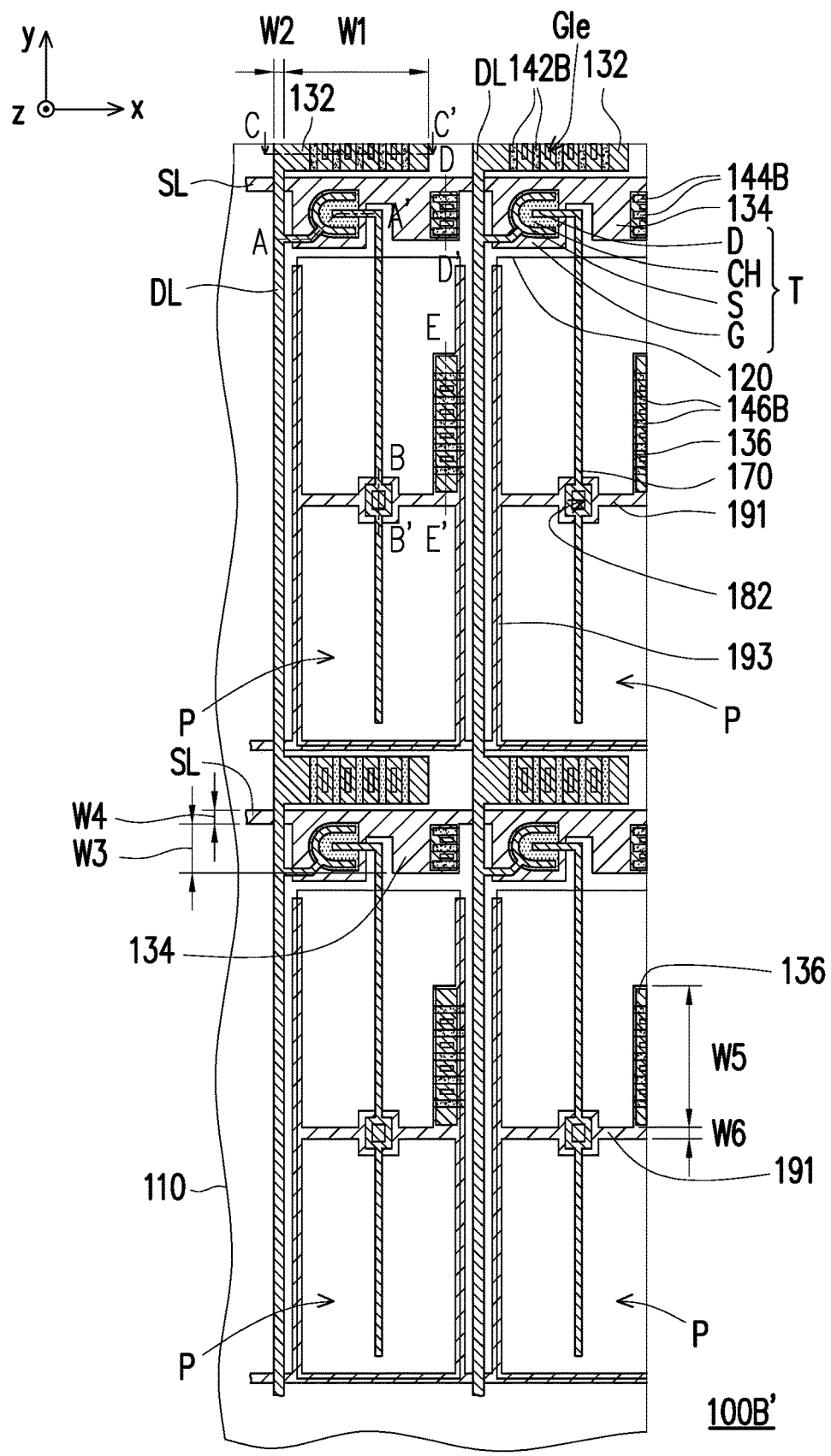
FIG. 20 is a top view of a pixel array substrate 100B' of the resized display apparatus 1B' of yet another embodiment of the invention.
Figure 21:
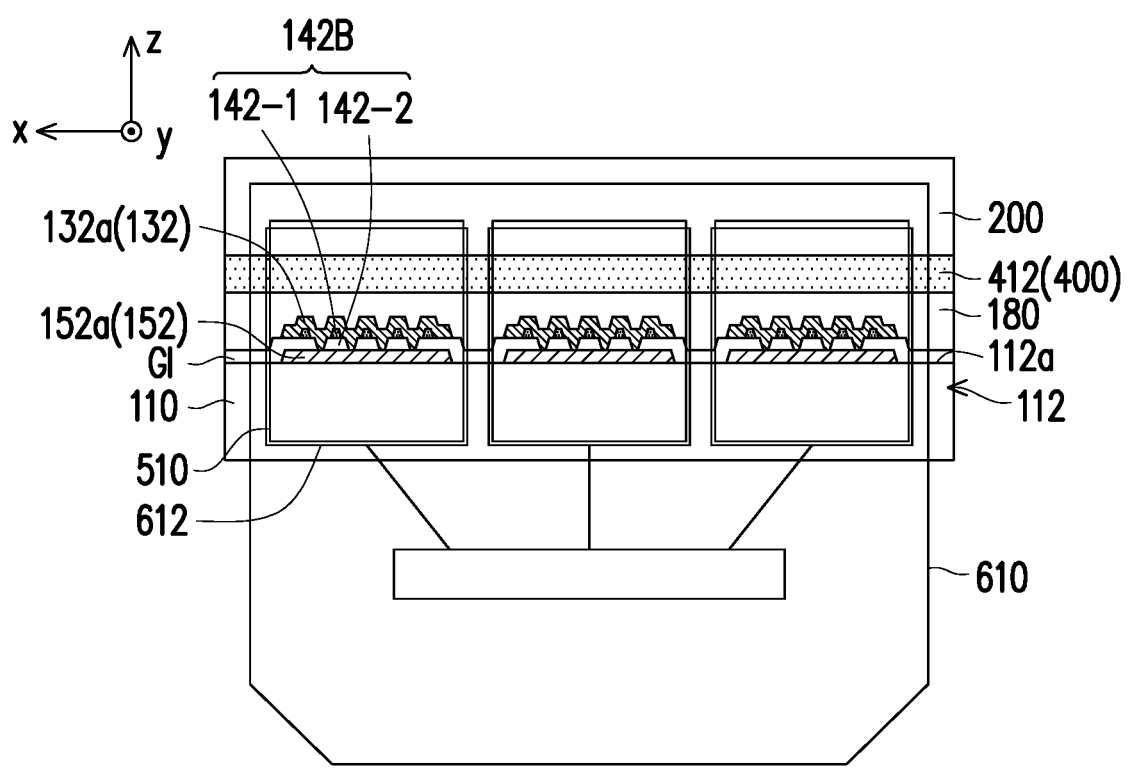
FIG. 21 is a side wall view of the resized display apparatus 1B' of yet another embodiment of the invention.
Figure 22:
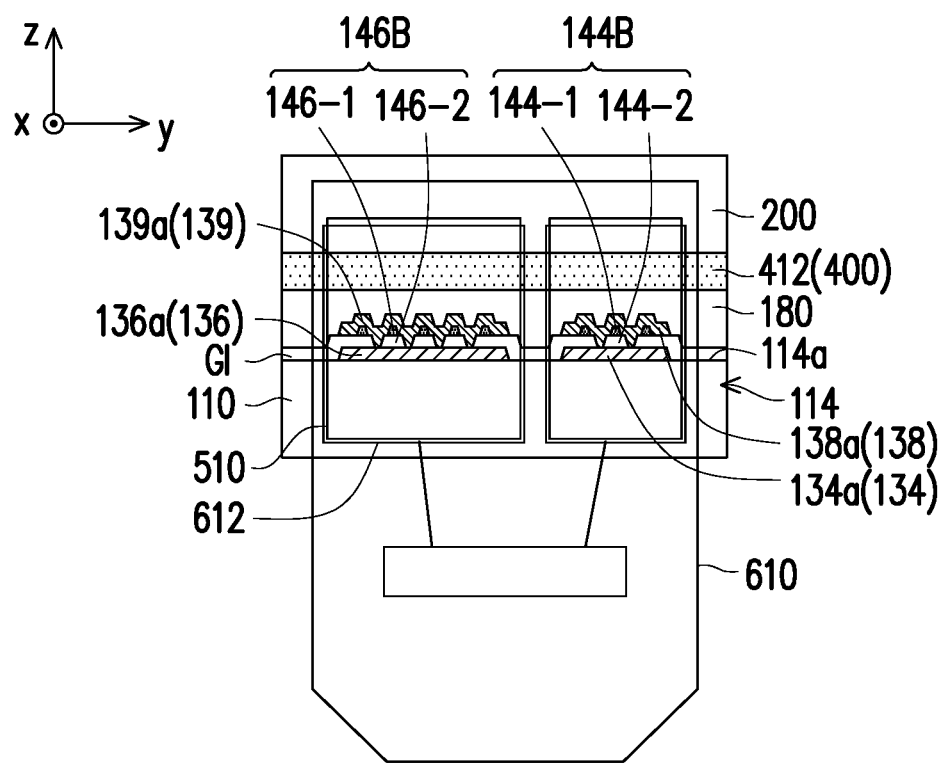
FIG. 22 is another side wall view of the resized display apparatus 1B' of yet another embodiment of the invention.

FIG. 19 is a cross section of a resized display apparatus 1B' of yet another embodiment of the invention. FIG. 20 is a top view of a pixel array substrate 100B' of the resized display apparatus 1B' of yet another embodiment of the invention. FIG. 21 is a side view of the resized display apparatus 1B' of yet another embodiment of the invention. FIG. 22 is a side view of the resized display apparatus 1B' of yet another embodiment of the invention.

Referring to FIG. 18, FIG. 19, FIG. 20, and FIG. 21, similarly, by cutting the display apparatus 1B above and filling the sealant 400 between the first substrate 110 and the second substrate 200 of the display apparatus 1B after cutting, the resized display apparatus 1B' can be formed. The method of forming the resized display apparatus 1B' is similar to the embodiments above and can be implemented by those having ordinary skill in the art based on the descriptions above, and is therefore not repeated herein.

The display apparatuses 1B and 1B' of the present embodiment are similar to the display apparatuses 1A and 1A' above, and one of the differences between the two is as follows. Protrusions 142B of the display apparatuses 1B and 1B' include a first sub-protrusion 142-1 disposed on the first substrate 110 and a second sub-protrusion 142-2 stacked with the first sub-protrusion 142-1. The material of the first sub-protrusion 142-1 and the material of the gate-insulating layer are the same. The material of the second sub-protrusion 142-2 and the material of the semiconductor pattern CH are the same. The protrusions 142B are formed by stacking the first sub-protrusion 142-1 and the second sub-protrusion 142-2 belonging to two different film layers, and therefore the protrusions 142B have a greater height. Accordingly, the pad 132 covering the higher protrusions 142B can be filled in the deeper gap g1, and when the side wall 132a is formed by polishing the pad 132, the side wall 132a has a greater area to facilitate an increase in the contact area between the conductive pattern 510 and the side wall 132a of the pad 132 and a reduction in contact resistance to further increase the reliability of the display apparatus 1B'.

From another perspective, in the present embodiment, the pad 132 is electrically connected to the auxiliary conductive pattern 152 via a plurality of the opening GIe of the gate-insulating layer GI, the plurality of openings GIe of the gate-insulating layer GI define a plurality of first sub-protrusions 142-1, and the plurality of openings GIe can be disposed on the predetermined scribe line 10 or located near the scribe line 10 and in a region to be polished. Accordingly, when the pixel array substrate 100B is cut and/or polished, the pad 132 located in the openings GIe of the gate-insulating layer is also cut and/or polished to be exposed at the side wall 112 of the pixel array substrate 100B to form a greater cross-sectional area (i.e., the side wall 132a of the pad 132). Accordingly, the contact area between the conductive pattern 510 and the side wall 132a of the pad 132 is increased, and contact resistance is reduced, such that the reliability of the display apparatus 1B' is further increased.

Similarly, the protrusions 144B and 146B of the display apparatuses 1B and 1B' respectively include first sub-protrusions 144-1 and 146-1 disposed on the first substrate 110 and second sub-protrusions 144-2 and 146-2 stacked with the first sub-protrusions 144-1 and 146-1. The material of the first sub-protrusions 144-1 and 146-1 and the material of the gate-insulating layer GI are the same. The material of the second sub-protrusions 144-2 and 146-2 and the material of the semiconductor pattern CH are the same. The protrusions 144B and 146B are formed by stacking the first sub-protrusions 144-1 and 146-1 and the second sub-protrusions 144-2 and 146-2 belonging to two different film layers, and therefore the protrusions 144B and 146B have a greater height. Accordingly, the auxiliary conductive patterns 138 and 139 covering the higher protrusions 144B and 146B can be filled in the deeper gaps g2 and g3, and when the side walls 138a and 139a are formed by polishing the auxiliary conductive patterns 138 and 139, the side walls 138a and 139a have a greater area to facilitate an increase in the contact area between the conductive pattern 530 and the side walls 138a and 139a of the auxiliary conductive patterns 138 and 139 and a reduction in contact resistance to further increase the reliability of the display apparatus 1B'.

From another perspective, in the present embodiment, the auxiliary conductive patterns 138 and 139 are electrically connected to the pads 134 and 136 via a plurality of the openings GIf and GIg of the gate-insulating layer GI, the plurality of openings GIf and GIg of the gate-insulating layer GI define a plurality of first sub-protrusions 144-1 and 146-1, and the plurality of openings GIf and GIg can be disposed on the predetermined scribe line 10 or located near the scribe line 10 and in a region to be polished. Accordingly, when the pixel array substrate 100B is cut and/or polished, the auxiliary conductive patterns 138 and 139 located in the openings GIf and GIg of the gate-insulating layer GI are also cut and/or polished to be exposed at the side wall 114 of the pixel array substrate 100B to form a greater cross-sectional area (i.e., the side walls 138a and 139a of the auxiliary conductive patterns 138 and 139). Accordingly, the contact area between the conductive pattern 520 and the side walls 138a and 139a of the auxiliary conductive patterns 138 and 139 is increased, and contact resistance is reduced, such that the reliability of the display apparatus 1B' is further increased.

Based on the above, a display apparatus of an embodiment of the invention includes a first substrate, a plurality of signal lines disposed on the first substrate, a plurality of pixels disposed on the first substrate, a second substrate disposed opposite to the first substrate, and a display medium disposed between the first substrate and the second substrate. At least one of the pixels includes a thin-film transistor, a pixel electrode, a pad, and a plurality of protrusions. The thin-film transistor is electrically connected to a corresponding signal line. The pixel electrode is electrically connected to the thin-film transistor. The pad is electrically connected to the signal line. The pad covers the plurality of protrusions.

When the display apparatus above is polished in the resizing process, since the pad covers a plurality of protrusions, the area of the side wall of the pad formed by polishing is large. Accordingly, when the conductive pattern is formed on the side wall of the first substrate, the contact area between the conductive pattern and the side wall of the pad is large and the contact resistance is small, and therefore the reliability of the resized display apparatus can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A display apparatus, comprising:
   a first substrate;
   a plurality of signal lines disposed on the first substrate;
   a plurality of common lines disposed on the first substrate;
   a plurality of pixels disposed on the first substrate, wherein at least one of the pixels comprises:
      a thin-film transistor electrically connected to a corresponding signal line of the plurality of signal lines;
      a pixel electrode electrically connected to the thin-film transistor;
      a first pad electrically connected to the corresponding signal line;
      a second pad electrically connected to a corresponding common line;
      a plurality of first protrusions, wherein the first pad covers the first protrusions; and
      a plurality of second protrusions, wherein the second pad covers the second protrusions;
   a second substrate disposed opposite to the first substrate;
   a display medium disposed between the first substrate and the second substrate; and
   at least one second conductive pattern disposed on a side wall of the first substrate and in contact with a side wall of the second pad of the at least one pixel and a side wall of each of the second protrusions.

2. The display apparatus of claim 1, further comprising:
   a first conductive pattern disposed on the side wall of the first substrate and in contact with a side wall of the first pad of the at least one pixel and a side wall of each of the first protrusions.

3. The display apparatus of claim 2, further comprising:
   a flexible circuit board having an electrode, wherein the electrode is electrically connected to the first pad of the at least one pixel via the first conductive pattern.

4. The display apparatus of claim 1, further comprising:
   a sealant covering the first pad of the at least one pixel and located between the first pad and the second substrate, wherein a side wall of the sealant is aligned with the side wall of the first substrate and a side wall of each of the first protrusions.

5. The display apparatus of claim 1, wherein the first substrate has an edge intersected with an extending direction of the corresponding signal line, and the first protrusions are arranged along the edge.

6. The display apparatus of claim 1, wherein the first substrate has an edge intersected with an extending direction of the corresponding signal line, and a width of the first pad on the edge is greater than a width of the corresponding signal line on the edge.

7. The display apparatus of claim 1, wherein the first pad of the at least one pixel covers the first protrusions and a gap between the first protrusions.

8. The display apparatus of claim 1, wherein the thin-film transistor comprises a semiconductor pattern, and a material of the first protrusions is the same as a material of the semiconductor pattern of the thin-film transistor.

9. The display apparatus of claim 1, wherein the thin-film transistor comprises a gate, a semiconductor pattern, and a gate-insulating layer disposed between the gate and the semiconductor pattern, and each of the first protrusions comprises:

a first sub-protrusion disposed on the first substrate, wherein a material of the first sub-protrusion is the same as a material of the gate-insulating layer; and a second sub-protrusion stacked with the first sub-protrusion, wherein a material of the second sub-protrusion is the same as a material of the semiconductor pattern.

10. The display apparatus of claim 1, wherein the first pad of the at least one pixel and the corresponding signal line belong to a same film layer.

11. The display apparatus of claim 1, wherein the pixel electrode of the at least one pixel is partially overlapped with the second pad.

12. The display apparatus of claim 1, further comprising:
a flexible circuit board having an electrode, wherein the electrode is electrically connected to the second pad of the at least one pixel via the at least one second conductive pattern.

13. The display apparatus of claim 1, further comprising:
a sealant covering the second pad of the at least one pixel and located between the second pad and the second substrate, wherein a side wall of the sealant is aligned with the side wall of the first substrate and the side wall of each of the second protrusions.

* * * * *